(12) United States Patent
Kaida et al.

(10) Patent No.: US 7,583,007 B2
(45) Date of Patent: Sep. 1, 2009

(54) PIEZOELECTRIC VIBRATOR

(75) Inventors: Hiroaki Kaida, Moriyama (JP); Shungo Kanai, Oumihachiman (JP); Hitoshi Sakaguchi, Toyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/187,965

(22) Filed: Aug. 7, 2008

(65) Prior Publication Data
US 2008/0290759 A1    Nov. 27, 2008

Related U.S. Application Data

(63) Continuation of application No. PCT/JP2007/051289, filed on Jan. 26, 2007, and a continuation of application No. PCT/JP2006/325395, filed on Dec. 20, 2006.

(30) Foreign Application Priority Data

Feb. 8, 2006   (JP)  ............... 2006-030562
Jul. 28, 2006  (JP)  ............... 2006-205872

(51) Int. Cl.
    *H01L 41/08* (2006.01)
(52) U.S. Cl. ...................... 310/320; 310/333
(58) Field of Classification Search ............ 310/320, 310/333, 365, 359
    See application file for complete search history.

(56) References Cited

U.S. PATENT DOCUMENTS

| | | | | |
|---|---|---|---|---|
| 4,939,403 | A | * | 7/1990 | Kittaka et al. ............ 310/320 |
| 5,084,647 | A | * | 1/1992 | Inoue et al. ............. 310/320 |
| 5,091,671 | A | * | 2/1992 | Yoshida ................. 310/358 |
| 5,274,293 | A | * | 12/1993 | Inoue et al. ............. 310/320 |
| 5,294,860 | A | * | 3/1994 | Gamo .................. 310/320 |
| 5,399,997 | A | * | 3/1995 | Yoshida ................. 331/158 |
| 5,422,532 | A | * | 6/1995 | Inoue et al. ............. 310/326 |
| 5,444,326 | A | * | 8/1995 | Yoshida ................. 310/359 |
| 5,621,263 | A | * | 4/1997 | Kaida .................. 310/333 |

(Continued)

FOREIGN PATENT DOCUMENTS

JP          57202112        12/1982

(Continued)

OTHER PUBLICATIONS

International Search Report.

*Primary Examiner*—Jaydi SanMartin
(74) *Attorney, Agent, or Firm*—Dickstein Shapiro LLP

(57) ABSTRACT

An energy-trapping strip piezoelectric vibrator utilizing a third harmonic overtone of a thickness shear mode is provided. A piezoelectric vibrator 1 has a strip piezoelectric ceramic substrate 2 polarized in a longitudinal direction, and first and second excitation electrodes 3 and 4 provided on first and second principal surfaces 2a and 2b of the piezoelectric ceramic substrate 2. An excitation region 5 including a piezoelectric vibration portion that includes a portion where the first and second excitation electrodes 3 and 4 overlap and that utilizes harmonics of the thickness shear mode is formed. A region around the piezoelectric vibration portion is set as a non-excitation region. At least a region of the non-excitation region neighboring the piezoelectric vibration portion is a region having the same polarization axis direction as the excitation region 5 and a relatively small polarization degree or is an unpolarized region.

18 Claims, 19 Drawing Sheets

U.S. PATENT DOCUMENTS

| | | | |
|---|---|---|---|
| 5,834,882 A * | 11/1998 | Bishop | 310/359 |
| 6,232,699 B1 * | 5/2001 | Wajima | 310/320 |
| 6,448,690 B2 * | 9/2002 | Sawai et al. | 310/320 |
| 6,538,361 B2 * | 3/2003 | Yoshida | 310/320 |
| 6,717,335 B2 * | 4/2004 | Nishimura et al. | 310/364 |
| 6,764,609 B2 * | 7/2004 | Takahashi | 252/62.9 R |
| 6,836,055 B2 * | 12/2004 | Sasaki | 310/320 |
| 6,967,432 B2 * | 11/2005 | Mitani et al. | 310/358 |
| 7,446,454 B2 * | 11/2008 | Kaida et al. | 310/320 |
| 2003/0122450 A1 * | 7/2003 | Mitani et al. | 310/321 |
| 2003/0160545 A1 * | 8/2003 | Sasaki | 310/333 |

FOREIGN PATENT DOCUMENTS

| | | | |
|---|---|---|---|
| JP | 01114209 | | 5/1989 |
| JP | 04222108 A | * | 8/1992 |
| JP | 07058233 A | * | 3/1995 |
| JP | 09139651 | | 5/1997 |
| JP | 10200364 | | 7/1998 |
| JP | 2002208829 A | * | 7/2002 |
| JP | 2003008391 | | 1/2003 |
| JP | 2003249836 | | 9/2003 |
| JP | 2004304704 | | 10/2004 |
| JP | 2005244184 | | 9/2005 |
| JP | 200633195 | | 2/2006 |
| WO | WO2007091433 | | 8/2007 |

* cited by examiner

PIEZOELECTRIC VIBRATOR

This is a continuation of application Serial Nos. PCT/JP2006/325395, filed Dec. 20, 2006 and PCT/JP2007/051289, filed Jan. 26, 2007.

TECHNICAL FIELD

The present invention relates to piezoelectric vibrators utilizing a thickness shear vibration mode. More particularly, the present invention relates to an energy-trapping piezoelectric vibrator that is constituted using a piezoelectric ceramic substrate and that utilizes a third harmonic overtone of the thickness shear vibration mode.

BACKGROUND ART

Conventionally, piezoelectric ceramic resonators utilizing a basic thickness shear vibration mode have been widely used as resonators in the band of 3.5-12 MHz. Such piezoelectric ceramic resonators utilizing the basic thickness shear vibration mode are disclosed in various documents regarding the related art, such as Patent Document 1.

FIG. 34 is a perspective view showing a conventional piezoelectric ceramic resonator utilizing a fundamental wave of a thickness shear vibration mode.

The piezoelectric ceramic resonator 101 is a so-called strip piezoelectric resonator. Here, a piezoelectric ceramic substrate in a shape of a rectangular plate having a longitudinal direction and a width direction, namely, a strip piezoelectric ceramic substrate 102, is used.

The piezoelectric ceramic substrate 102 is polarized in the longitudinal direction as shown by an illustrated arrow P.

A first excitation electrode 103 is formed on an upper face of the piezoelectric ceramic substrate 102 to extend from a substantial central area to a longitudinal end 102a of the piezoelectric ceramic substrate 102. In addition, the excitation electrode 103 is formed to reach both width-direction ends at the substantial center of the piezoelectric ceramic substrate 102.

A second excitation electrode 104 is formed on a lower face to overlap the excitation electrode 103 at the longitudinal center of the piezoelectric ceramic substrate 102. The second excitation electrode 104 extends from the substantial center of the piezoelectric ceramic substrate 102 toward an end 102b of the piezoelectric ceramic substrate 102.

Patent Document 1: Japanese Unexamined Patent Application Publication No. 10-200364

DISCLOSURE OF INVENTION

The resonant frequency of the thickness shear vibration mode is inversely proportional to the thickness of a piezoelectric ceramic substrate 102. Accordingly, to obtain a piezoelectric ceramic resonator 101 that can be used at higher frequencies, the thickness of the piezoelectric ceramic substrate 102 has to be reduced. Thus, the mechanical strength of the piezoelectric ceramic substrate 102 decreases and there is a limit in coping with higher frequencies.

On the other hand, not only a fundamental wave but also a third harmonic overtone, for example, can be excited in the thickness shear vibration mode. In the case of using the third harmonic overtone, a resonance characteristic of a trebled frequency of the fundamental wave can be obtained. Accordingly, the resonance characteristic of the trebled frequency of the fundamental wave can be obtained without decreasing the thickness of the piezoelectric ceramic substrate 102.

However, unlike the fundamental wave, there is a problem that the third harmonic overtone of the thickness shear mode cannot be trapped in a piezoelectric vibration portion where excitation electrodes overlap one another through a piezoelectric ceramic substrate.

More specifically, application of alternating voltage to a portion where excitation electrodes 103 and 104 overlap through the piezoelectric ceramic substrate 102 in the piezoelectric ceramic resonator 101 shown in FIG. 34 causes the thickness shear vibration mode. In the thickness shear vibration mode, the fundamental wave is trapped in the piezoelectric vibration portion where the excitation electrodes 103 and 104 overlap. Accordingly, a resonance characteristic based on the fundamental wave can be utilized.

However, the third harmonic overtone is not trapped in the piezoelectric vibration portion. Accordingly, it is difficult to mechanically support the piezoelectric ceramic resonator without affecting the resonance characteristic of the third harmonic overtone. Thus, in practice, a piezoelectric ceramic resonator utilizing the third harmonic overtone of the thickness shear vibration mode is not realized.

An object of the present invention is to provide an energy-trapping piezoelectric vibrator utilizing a third harmonic overtone of the thickness shear vibration mode that utilizes the third harmonic overtone of the thickness shear vibration mode and that can trap vibration energy of the third harmonic overtone.

According to a first embodiment of the invention, provided is a piezoelectric vibrator characterized by including: a strip piezoelectric ceramic substrate having first and second principal surfaces facing each other, having a longitudinal direction and a width direction vertical to the longitudinal direction, and polarized in the longitudinal direction; a first excitation electrode extending in the width direction of the piezoelectric ceramic substrate at a substantial longitudinal center part of the first principal surface of the piezoelectric ceramic substrate; and a second excitation electrode overlapping the first excitation electrode through the piezoelectric ceramic substrate at the substantial center part of the piezoelectric ceramic substrate of the second principal surface of the piezoelectric ceramic substrate. An energy-trapping piezoelectric vibration portion utilizing a third harmonic overtone of a thickness shear mode is formed at a portion where the first and second excitation electrodes overlap. Regions around an excitation region excited in response to application of an alternating electric field to the piezoelectric vibration portion are set as non-excitation regions. Regions of the non-excitation regions neighboring the excitation region are regions that have the same polarization axis direction as the excitation region and a polarization degree whose absolute value is smaller than the absolute value of a polarization degree of the excitation region or unpolarized regions.

In a specific aspect of the first embodiment, an overlapping length that is a length of the portion where the first and second excitation electrodes overlap in the piezoelectric vibration portion along the longitudinal direction of the piezoelectric ceramic substrate is shorter than the length of the excitation region along the longitudinal direction of the piezoelectric ceramic substrate.

In another specific aspect of the piezoelectric vibrator according to the first embodiment, the entire non-excitation region is a region having the same polarization axis direction as the excitation region and a polarization degree whose absolute value is smaller than the absolute value of the polarization degree of the excitation region or an unpolarized region.

In another specific aspect of the piezoelectric vibrator according to the first embodiment, regions of the non-excitation regions other than the regions neighboring the excitation region having the same polarization axis direction as the excitation region and a polarization degree whose absolute value is smaller than the absolute value of the polarization degree of the excitation region or the regions neighboring the excitation region that are not polarized are polarized in the same manner as the excitation region.

In addition, in still another specific aspect of the present invention, the entire non-excitation region is polarized. Preferably, the entire non-excitation region is polarized in the same polarization direction as the excitation region.

According to a second embodiment, provided is a piezoelectric vibrator characterized by including: a strip piezoelectric ceramic substrate having first and second principal surfaces facing each other, having a longitudinal direction and a width direction vertical to the longitudinal direction, and polarized in the longitudinal direction; a first excitation electrode extending in the width direction of the piezoelectric ceramic substrate at a substantial longitudinal center part of the first principal surface of the piezoelectric ceramic substrate; and a second excitation electrode overlapping the first excitation electrode through the piezoelectric ceramic substrate at the substantial center part of the piezoelectric ceramic substrate of the second principal surface of the piezoelectric ceramic substrate. An energy-trapping piezoelectric vibration portion utilizing the third harmonic overtone of a thickness shear mode is formed at a portion where the first and second excitation electrodes overlap. Regions around an excitation region excited in response to application of an alternating electric field to the piezoelectric vibration portion are set as non-excitation regions. The Young's modulus of portions of the non-excitation regions neighboring the excitation region is set smaller than that of the excitation portion.

Herein, the Young's modulus of the excitation region and the Young's modulus of the non-excitation region indicate the Young's modulus of the piezoelectric ceramic substrate in the longitudinal direction. More specifically, since the Young's modulus has the anisotropy when the piezoelectric ceramic substrate is polarized, the above-described Young's modulus of the excitation region and the Young's modulus of the non-excitation region indicate the Young's modulus in the longitudinal direction.

In a specific aspect of the piezoelectric vibrator according to the second embodiment, an overlapping length that is a length of the portion where the first and second excitation electrodes overlap in the piezoelectric vibration portion along the longitudinal direction of the piezoelectric ceramic substrate is shorter than a length of the excitation region along the longitudinal direction of the piezoelectric ceramic substrate.

In another aspect of the piezoelectric vibrator according to the second embodiment, the Young's modulus of the entire non-excitation region is set smaller than that of the excitation region.

In another aspect of the second embodiment, the piezoelectric ceramic substrate has a first piezoelectric ceramic plate constituting the excitation region and composed of a material having a relatively high Young's modulus and a second piezoelectric ceramic plate composed of a material having the Young's modulus lower than that of the first piezoelectric ceramic plate and constituting a portion of the non-excitation region having the relatively low Young's modulus. The first and second piezoelectric ceramic plates are laminated to constitute the piezoelectric ceramic substrate.

In still another specific aspect of the second embodiment, when the Young's modulus of the excitation region is set to 1, the Young's modulus of the portion of the non-excitation region having the relatively low Young's modulus is within the range of 0.80-0.999. Accordingly, vibration energy can be trapped in the excitation region more certainly.

In still another specific aspect of the piezoelectric vibrator according to the present invention, a dummy electrode thicker than the excitation electrodes is formed on at least one of the first and second principal surfaces of the piezoelectric ceramic substrate at the non-excitation region. When the dummy electrode thicker than the excitation electrode is formed, the dummy electrode lowers the frequency constant of the non-excitation region. That is, the frequency constant is proportional to (Young's modulus/density)$^{1/2}$. By forming thicker dummy electrode, an effect equivalent to the case of lowering the Young's modulus is obtained at the non-excitation region, which further increases the frequency constant of the excitation region relatively and traps the vibration energy further efficiently.

In a still further specific aspect of the piezoelectric vibrator according to the present invention, the excitation electrodes are formed to reach edges located at respective width-direction ends of the piezoelectric ceramic substrate. Accordingly, the piezoelectric vibrator of the present invention can be manufactured easily using a manufacturing method for connecting a mother piezoelectric substrate after forming electrode films on the mother piezoelectric substrate to obtain strip piezoelectric resonators.

In another specific aspect of the piezoelectric vibrator according to the present invention, the first and second excitation electrodes do not reach edges located at respective width-direction ends of the piezoelectric ceramic substrate but is separated from the edges by a gap. In this manner, the excitation electrodes may be separated from the edges of the piezoelectric substrate by a gap. In such a case, since the excitation electrodes do not exist on a cutting line at the time of cutting the substrate into elements, it is possible to prevent the characteristic from worsening due to electrode burr or peeling caused at the cutting.

In addition, the piezoelectric vibration portion is a portion where the first and second excitation electrodes overlap through the piezoelectric ceramic substrate in the present invention. The excitation region is a region substantially excited in response to application of alternating voltage to the first and second excitation electrodes but does not necessarily correspond to the portion where the first and second excitation electrodes overlap. More specifically, when the first and second excitation electrodes are separated from the edges of the ceramic substrate by a gap, the portion where the gap is provided is included in the excitation region. Accordingly, when the substrate is positively excited by applying the alternating voltage to the first and second excitation electrodes, a portion where the vibration energy of the third harmonic overtone is substantially trapped is the excitation region and the rest of the region is the non-excitation region.

A first manufacturing method of a piezoelectric vibrator according the present invention is characterized by including: a step of preparing a mother piezoelectric ceramic substrate having first and second principal surfaces facing each other, a longitudinal direction and a width direction vertical to the longitudinal direction, and first and second end faces at respective longitudinal ends; a first polarization step of forming polarization electrodes on the first and second end faces of the mother piezoelectric ceramic substrate and polarizing the mother piezoelectric ceramic substrate in the longitudinal direction; a second polarization step of polarizing the mother piezoelectric ceramic substrate so that a polarization degree of a portion where an excitation region is formed becomes higher than that of a portion where a non-excitation region is formed in the mother ceramic substrate; a step of forming a plurality of first and second excitation electrodes on the respective principal surfaces of the mother piezoelectric ceramic substrate; and a step of cutting the mother piezoelectric ceramic substrate into individual piezoelectric vibrators.

In a specific aspect of the first manufacturing method, the step of polarizing the mother piezoelectric ceramic substrate so that the polarization degree of the excitation region becomes higher than that of the non-excitation region is carried out by forming floating electrodes at the excitation region of the first and second principal surfaces of the mother piezoelectric ceramic substrate, and applying direct voltage across the first and second end faces of the mother piezoelectric ceramic substrate in a direction opposite to that of the first polarization step to lower the polarization degree of the non-excitation region.

In another specific aspect of the first manufacturing method, the step of polarizing the mother piezoelectric ceramic substrate so that the polarization degree of the excitation region becomes higher than that of the non-excitation region is carried out by forming floating electrodes at the non-excitation region of the first and second principal surfaces of the mother piezoelectric ceramic substrate, and applying direct voltage across the first and second end faces of the mother piezoelectric ceramic substrate in the same direction as that of the first polarization step.

A second manufacturing method of a piezoelectric vibrator of the present invention is characterized by including: a step of preparing a mother piezoelectric ceramic substrate having first and second principal surfaces facing each other, a longitudinal direction and a width direction vertical to the longitudinal direction, and first and second end faces at respective longitudinal ends; a step of forming polarization electrodes on the first and second end faces of the mother piezoelectric ceramic substrate and forming floating electrodes at boundaries of an excitation region and a non-excitation region of the first and second principal surfaces; a first polarization step of polarizing the mother piezoelectric ceramic substrate so that polarization directions of regions on both sides of the floating electrodes in the longitudinal direction of the mother piezoelectric ceramic substrate are opposite in the longitudinal direction in the mother piezoelectric ceramic substrate; a second polarization step of applying voltage across the floating electrodes on both sides of the excitation electrodes to increase only the polarization degree of the excitation region after the first polarization step; a step of forming a plurality of first and second excitation electrodes on the first and second principal surfaces of the mother piezoelectric ceramic substrate; and a step of cutting the mother piezoelectric ceramic substrate into individual piezoelectric vibrators.

ADVANTAGES OF THE INVENTION

According to the first embodiment, at least the region of the non-excitation region neighboring the excitation region is a region having the same polarization axis direction as the excitation region and a polarization degree whose absolute value is smaller than the absolute value of the polarization degree of the piezoelectric vibration portion or a region that is not polarized, the third harmonic overtone of the thickness shear mode is excited in response to application of alternating voltage to the first and second excitation electrodes and the vibration energy of the third harmonic overtone is trapped in the piezoelectric vibration portion. Although a reason why the third harmonic overtone of the thickness shear mode is trapped in the piezoelectric ceramic substrate is not exactly clear, it is considered that the third harmonic overtone of the thickness shear vibration is trapped by the difference in the polarization structures of the piezoelectric vibration portion and the regions neighboring the piezoelectric vibration portion.

According to the second embodiment, since the Young's modulus of at least a region of the non-excitation region neighboring the excitation region is set smaller than that of the excitation region, the third harmonic overtone of the thickness shear mode is excited in response to application of alternating voltage to the first and second excitation electrodes and the vibration energy of the third harmonic overtone is trapped in the piezoelectric vibration portion. Although a reason why the third harmonic overtone of the thickness shear mode is trapped in the piezoelectric ceramic substrate is not exactly clear, it is considered that the third harmonic overtone of the thickness shear vibration is trapped by the difference in the Young's modulus of the piezoelectric vibration portion and the Young's modulus of the region neighboring the piezoelectric vibration portion.

According to the present invention, the third harmonic overtone of the thickness shear mode is trapped in the piezoelectric vibration portion as described above. Since the energy-trapping piezoelectric vibrator can utilize the third harmonic overtone of the thickness shear mode, it is possible to provide a piezoelectric vibrator that can be used in a relatively high frequency band and that utilizes the thickness shear mode without increasing its size.

Figure 1:
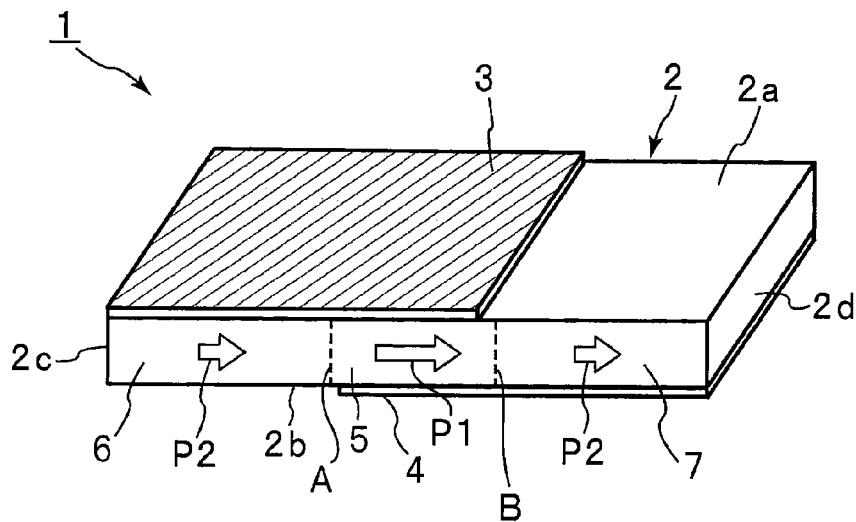
FIG. 1 is a perspective view showing a piezoelectric vibrator according to a first embodiment of the present invention.

REFERENCE NUMERALS 1 piezoelectric vibrator
2 piezoelectric ceramic substrate
2a first principal surface
2b second principal surface
2c, 2d end face
3 first excitation electrode
3a, 3b electrode film portion
4 second excitation electrode
4a, 4b electrode film portion
5 excitation region
6, 7 non-excitation region
6a, 7a region
6b, 7b region
6c, 7c region
11 case substrate
12, 13 electrode land
14, 15 conductive adhesive
21a, 21b polarization electrode
22a, 22b polarization electrode
23a, 23b polarization electrode
24a, 24b electrode
25 piezoelectric vibrator
31 piezoelectric vibrator
41 piezoelectric vibrator
43, 44 excitation electrode
43a electrode film portion
51 piezoelectric vibrator
52-54 piezoelectric vibrator
61 piezoelectric vibrator
62 piezoelectric ceramic substrate
62a first principal surface
62b second principal surface
62c, 62d end face
63 first excitation electrode
63a, 63b electrode film portion
64 second excitation electrode
64a, 64b electrode film portion
65 excitation region
66, 67 non-excitation region
G gap
H gap

BEST MODES FOR CARRYING OUT THE INVENTION

The following description of specific embodiments of the present invention will reveal the present invention.

FIG. 1 is a perspective view showing a piezoelectric vibrator according to a first embodiment of the present invention.

A piezoelectric vibrator 1 includes a strip piezoelectric ceramic substrate 2. Although the piezoelectric ceramic substrate 2 is composed of an appropriate piezoelectric ceramics, it is composed of a PZT piezoelectric ceramics in this embodiment.

The piezoelectric ceramic substrate 2 has an upper face 2a and a lower face 2b as first and second principal surfaces facing each other. In addition, the upper face 2a and the lower face 2b have a rectangular shape, which has a length direction and a width direction.

As shown by illustrated arrows P1 and P2, the piezoelectric ceramic substrate 2 is polarized in the length direction. More specifically, as shown by the arrow P1, a substantial length-direction central portion of the piezoelectric substrate 2 is intensely polarized in the length direction. The substantial central portion sandwiched by broken lines A and B constitutes an excitation region 5 to be described later. Regions on outer sides of the excitation region 5 are non-excitation regions 6 and 7. More specifically, as shown by the arrows P2, the non-excitation regions 6 and 7 on outer sides of the broken lines A and B are polarized in the length direction. Accordingly, the polarization directions of the excitation region and the non-excitation regions are the same. However, as the arrows P2 are illustrated shorter than the arrow P1, the polarization degree of the non-excitation regions 6 and 7 is set smaller than that of the excitation region 5.

A piezoelectric vibration portion corresponds to a portion to which an electric field caused by alternating voltage is directly applied in response to application of the alternating voltage to first and second excitation electrodes 3 and 4. In this embodiment, the piezoelectric vibration portion is narrower than the excitation region 5. This is because the excitation region 5 where the vibration is trapped and excited when the thickness shear vibration mode is caused in response to application of the electric field to the piezoelectric vibration portion is slightly broader than a region where the first and second excitation electrodes 3 and 4 overlap one another.

Needless to say, the size of the piezoelectric vibration portion may be equal to that of the excitation region depending on materials constituting the piezoelectric ceramic substrate, the vibration mode, and the frequency. Regions on outer sides of the excitation region 5 correspond to the non-excitation regions 6 and 7.

The first excitation electrode 3 is formed on the upper face 2a of the piezoelectric ceramic substrate 2 to extend from a substantial length-direction center to an edge of an end face 2c and the upper face 2a. The second excitation electrode 4 is formed on the lower face of the piezoelectric ceramic substrate 2. The second excitation electrode 4 is formed to extend from the substantial length-direction center of the piezoelectric ceramic substrate 2 to an edge of the lower face 2b and an end face 2d.

The first and second excitation electrodes 3 and 4 are composed of an appropriate metal, such as Al, or an alloy. A plurality of metal layers may be laminated to form the excitation electrodes 3 and 4.

In this embodiment, the first excitation electrode 3 and the second excitation electrode 4 face each other through the piezoelectric ceramic substrate 2 at a region sandwiched by the broken lines A and B. A portion where this first excitation electrode 3 and the second excitation electrode 4 overlap through the piezoelectric ceramic substrate 2, namely, a region between the broken lines A and B, constitutes the excitation region 5.

The excitation electrodes 3 and 4 are formed to extend to edges located at both width-direction ends of the piezoelectric ceramic substrate 2 at the excitation region 5.

In the piezoelectric vibrator 1 of this embodiment, the excitation region 5 is excited in response to application of alternating voltage across the first and second excitation electrodes 3 and 4. Since the polarization direction P1 is parallel to the length direction of the piezoelectric ceramic substrate 2 in this case, vibration of the thickness shear mode is caused at the excitation region 5. Additionally, when the piezoelectric ceramic substrate 2 in this embodiment is composed of, for example, a PZT ceramic having a size of 2.2 mm×0.43 mm×thickness of 0.3 mm, a resonance characteristic of the third harmonic overtone, among the vibrations of the thickness shear mode, appears around several tens of MHz and this resonance characteristic of the third harmonic overtone is utilized.

As described before, conventionally, a strip piezoelectric ceramic resonator utilizing the thickness shear mode can trap the fundamental wave of the thickness shear mode but cannot trap the third harmonic overtone. In contrast, the piezoelectric vibrator 1 of this embodiment can trap the third harmonic overtone in the excitation region 5. Accordingly, an effect on the resonance characteristic of the third harmonic overtone is unlikely to be caused even if the non-excited regions are mechanically supported. Thus, an energy-trapping piezoelectric resonator usable at a frequency band higher than that of the case of utilizing the fundamental wave can be provided utilizing the third harmonic overtone.

The inventors have experimentally found out that the third harmonic overtone is trapped in the excitation region 5 by forming the above-described polarization structure. Trapping of the third harmonic overtone of the thickness shear mode in the excitation region 5 will be described by showing the displacement distribution obtained by analyzing the displacement state of the piezoelectric vibrator 1 using a finite element method in FIG. 2.

Figure 2:
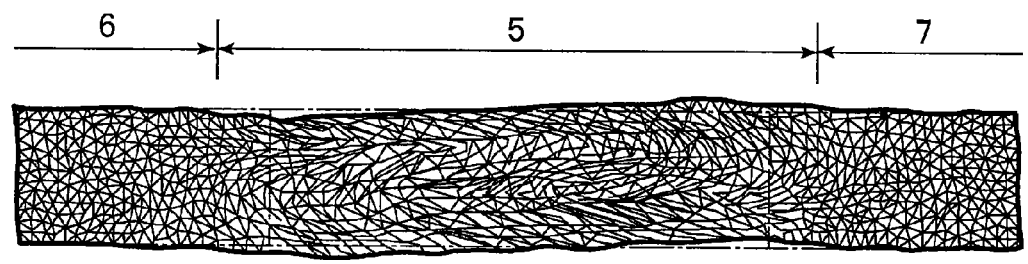
FIG. 2 is a schematic elevational sectional view schematically showing a displacement distribution analyzed using a finite element method in a state in which a third harmonic overtone is excited when a piezoelectric vibrator of a first embodiment is driven.

Meanwhile, a result of FIG. 2 assumes the case where the size of a piezoelectric ceramic substrate is 0.22 mm×0.43 mm×0.3 mm in the length, the length in the width direction, and the thickness, respectively, and voltage is applied to regions of the first and second excitation electrode 3 and 4. Additionally, the size of the excitation region 5 along the polarization direction P1, namely, the size along the length direction of the piezoelectric ceramic substrate 2, is set equal to 1.1 mm. In addition, an analysis is carried out while setting the polarization degree of the non-excitation regions lower by decreasing the Young's modulus of the material of the non-excitation regions relative to that of the excitation region. An analysis carried out while decreasing the Young's modulus of the material will be additionally described. More specifically, as the polarization degree decreases, the resonant frequency reduces and the frequency constant decreases. This frequency constant means the speed of sound and the speed of sound is proportional to the Young's modulus. Accordingly, the analysis is carried out while decreasing the ratio of the Young's modulus of the materials. The result of FIG. 2 is a case where the ratio of the Young's modulus is 0.96, that is, a case where the Young's modulus of the non-excitation regions is set smaller than that of the excitation region 5 by 4%.

As is clear from FIG. 2, the excitation region 5 displaces, whereas the non-excitation regions around the excitation region 5 hardly displace in the piezoelectric vibrator 1 of this embodiment. Accordingly, even if the third harmonic overtone of the thickness shear vibration mode is excited, the vibration energy is trapped in the excitation region 5.

It is considered that reasons why the third harmonic overtone is trapped by different polarization structures of the excitation region 5 and the non-excitation regions 6 and 7 therearound are as follows.

The excitation region 5, namely, excitation area, and the non-excitation regions 6 and 7 have different frequency constants. Since the frequency constant is larger at the excitation region than at the non-excitation regions, it is considered that the vibration can be trapped in the excitation region by this means. Thus, it is considered that energy trapping with the frequency being increased only in the excitation region is realized.

The piezoelectric vibrator of this embodiment can reduce spurious vibration at non-vibration portions by a difference in the piezoelectric of the excitation region and the non-excitation regions 6 and 7.

Figure 3:
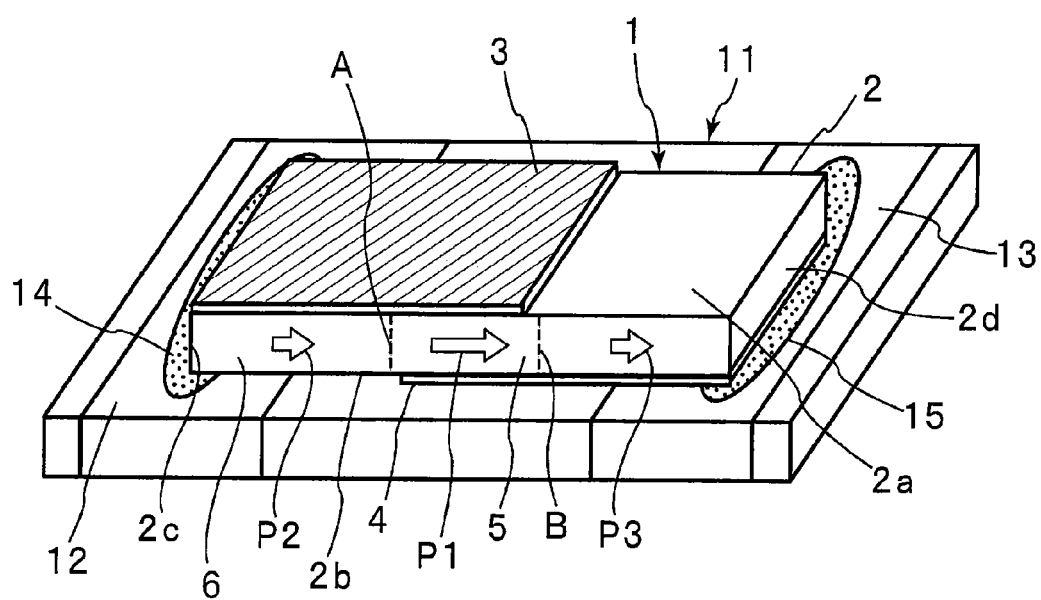
FIG. 3 is a perspective view schematically showing a structure in which a piezoelectric vibrator of a first embodiment is mounted on a case substrate.

As described above, the piezoelectric vibrator 1 of this embodiment can trap the vibration energy of the third harmonic overtone in the excitation region 5 while hardly leaking the vibration of the third harmonic overtone to the non-excitation regions 6 and 7. Thus, the piezoelectric vibrator 1 can be fixed to electrode lands 12 and 13 provided on a case substrate 11 using conductive adhesives 14 and 15, respectively, as shown in a perspective view of FIG. 3. More specifically, even if the non-excitation regions 6 and 7 are fixed with conductive adhesives 14 and 15, respectively, the resonance characteristic at the piezoelectric vibration portion, namely, the excitation region, is hardly affected. Thus, a small piezoelectric resonator component usable at a relatively high frequency band can be provided.

Figure 4:
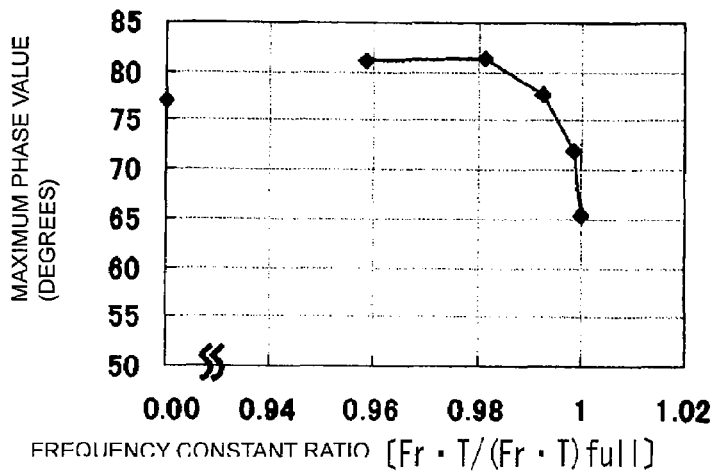
FIG. 4 is a diagram showing a relationship between a maximum phase value and a frequency constant ratio of a frequency constant of a non-excitation region to that of a piezoelectric vibration portion when a piezoelectric ceramic substrate is polarized by changing a polarization voltage.

FIG. 4 shows the relationship between the frequency constant ratio and the maximum phase value of the third harmonic overtone of the thickness shear mode. The frequency constant ratio is the ratio of a frequency constant of the non-excitation regions to the frequency constant of the excitation region when the polarization degree is changed by changing the polarization voltage. Here, the frequency constant is the product of thickness T of the piezoelectric ceramic substrate and a resonant frequency $F_r$. If the thickness of the piezoelectric ceramic substrate becomes ½, the resonant frequency is doubled. Since the product $F_r \cdot T$ is constant, it is referred to as the frequency constant. The frequency constant is a value decided according to various characteristics of the piezoelectric ceramic substrate.

Needless to say, since the resonant frequency differs even at the same thickness if the polarization degree differs, the frequency constant also changes. More specifically, the resonant frequency becomes lower and the frequency constant decreases if the polarization degree becomes lower. The dominator ($F_r \cdot T$) full of the horizontal axis represents the polarization degree of the excitation region 5, whereas the numerator $F_r \cdot T$ represents the polarization degree of the non-excitation regions 6 and 7. When the polarization degree of the non-excitation regions 6 and 7 is equal to the polarization degree of the excitation region 5 of the piezoelectric ceramic substrate 2, i.e., when the whole piezoelectric ceramic substrate is polarized uniformly, the frequency constant ratio is equal to 1. In addition, when the non-excitation regions 6 and 7 are not polarized, the frequency constant ratio is equal to 0.

As is clear from FIG. 4, the maximum phase value of the third harmonic overtone becomes larger as the polarization degree of the non-excitation regions 6 and 7 becomes smaller, i.e., as the frequency constant ratio becomes smaller, which indicates that the phase characteristic is improved. More specifically, when the polarization degree of the non-excitation regions 6 and 7 is smaller than that of the excitation region 5, it is known that the phase characteristic of the third harmonic overtone is improved as described above and the third harmonic overtone can be preferably excited and trapped. This will be described while showing a specific frequency characteristic.

Figure 5:
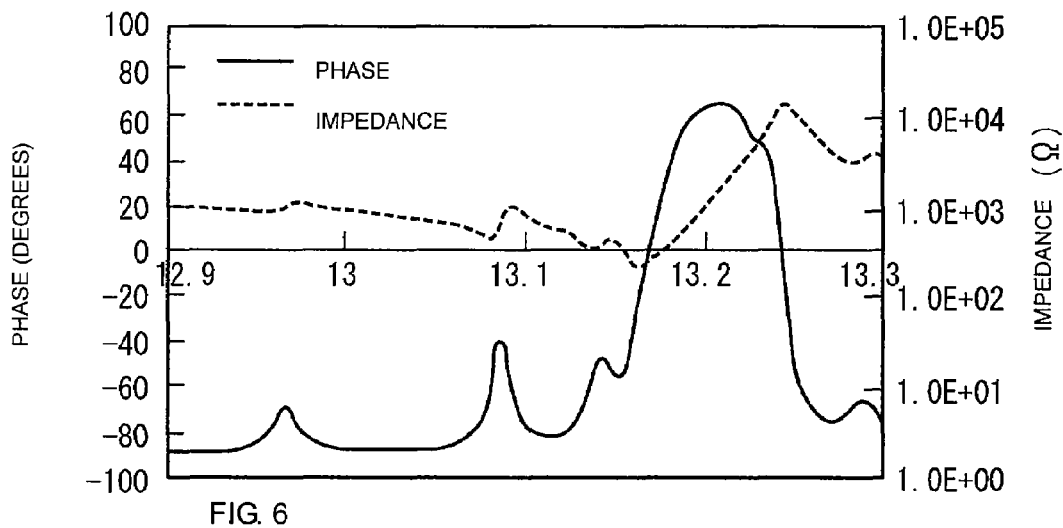
FIG. 5 is a diagram showing a phase characteristic and an impedance characteristic of a conventional piezoelectric vibrator prepared for comparison.

As a comparative example of the piezoelectric vibrator 1 of the above-described embodiment, a conventional piezoelectric vibrator configured in the same manner as that of the above-described embodiment except for a uniformly polarized piezoelectric ceramic substrate was created and the frequency characteristics thereof were measured. FIG. 5 shows a result. The solid line in FIG. 5 represents a phase characteristic, whereas the broken line represents the impedance characteristic.

Figure 6:
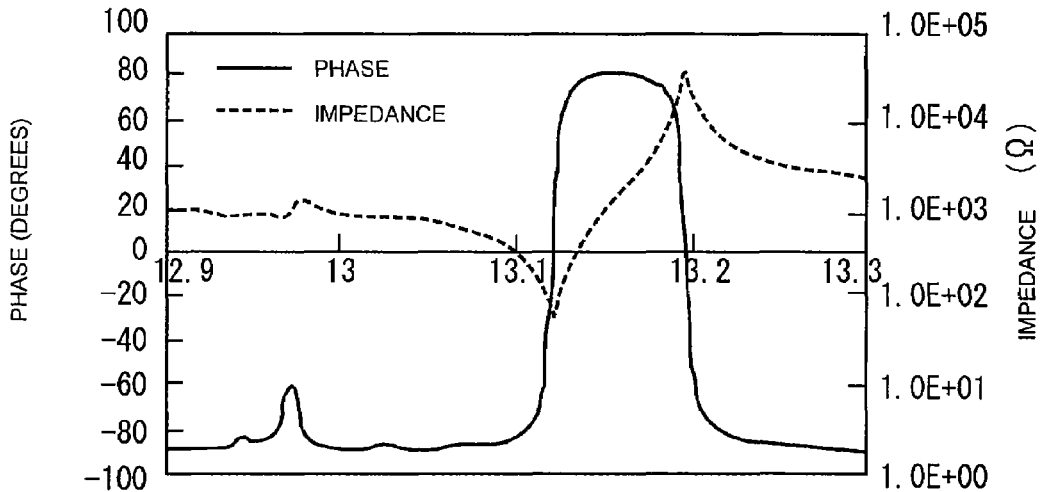
FIG. 6 is a diagram showing a phase characteristic and an impedance characteristic of a piezoelectric vibrator of a first embodiment.

In addition, FIG. 6 shows the phase characteristic and the impedance characteristic of the piezoelectric vibrator of the above-described embodiment. The solid line represents a phase characteristic, whereas the broken line represents an impedance characteristic.

In the scale of the impedance, 1.0E+01 represents 1×10 and 1.0E+02 represents 1×10².

As is clear from the comparison of FIGS. 5 and 6, it is seen that a response having a preferable resonance characteristic is obtained at a frequency around 13.2 MHz corresponding to the third harmonic overtone according to the above-described embodiment.

Figure 7:
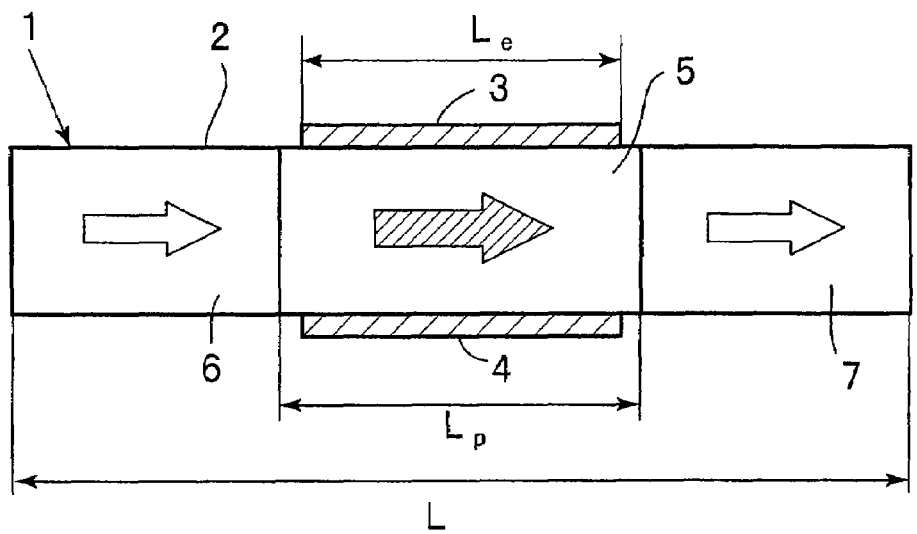
FIG. 7 is an elevational sectional view schematically showing a relationship between an excitation-electrode-overlapping length and a length of an excitation region in a piezoelectric vibrator of a first embodiment.
Figure 8:
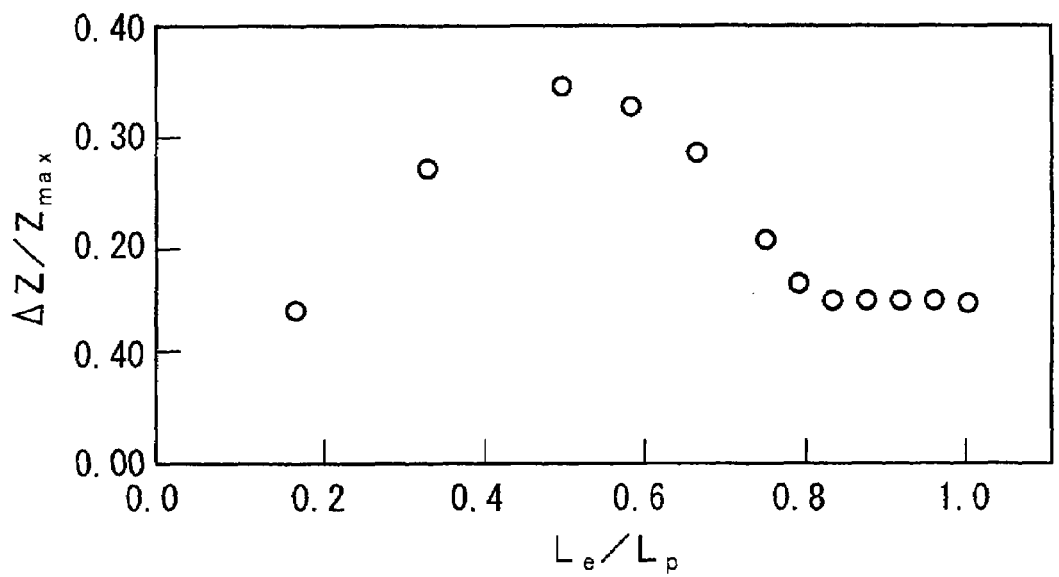
FIG. 8 is a diagram showing a change in a third-harmonic-overtone vibration trapping efficiency when an excitation-electrode-overlapping length is changed.
Figure 9:
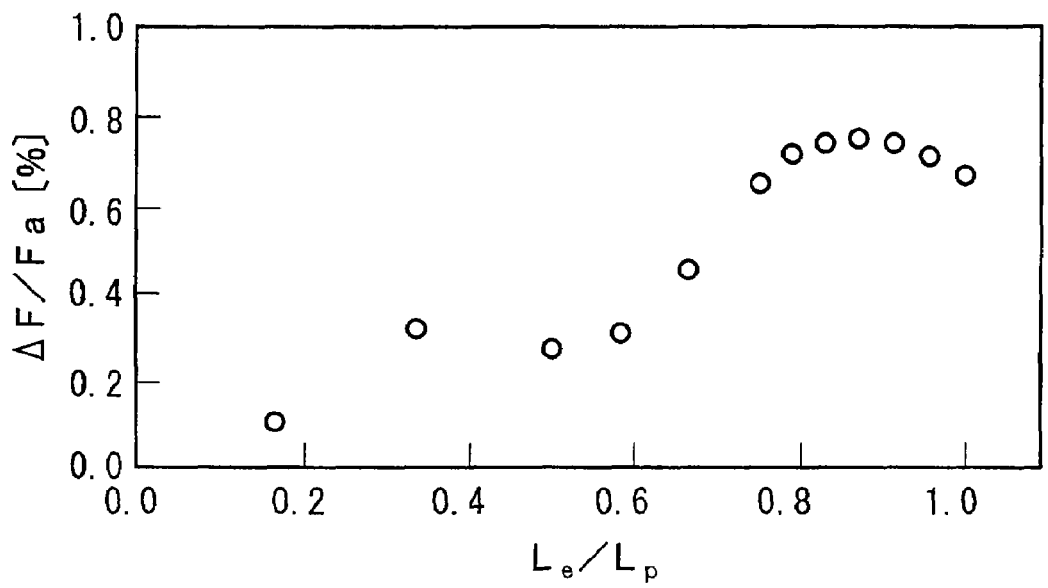
FIG. 9 is a diagram showing a change in a bandwidth ratio when an excitation-electrode-overlapping length is changed.

As described above, the piezoelectric vibration portion is narrower than the excitation region 5 in the first embodiment. More specifically, the excitation region 5 that is a polarized range with the higher polarization degree is slightly broader than the region where the first and second excitation electrodes 3 and 4 overlap. In addition, the length of the region where the first and second excitation electrodes 3 and 4 overlap along the length direction of the piezoelectric ceramic substrate 2 is referred to as an excitation-electrode-overlapping length. As shown by a schematic elevational sectional view in FIG. 7, this excitation-electrode-overlapping length is represented by $L_e$. On the other hand, the length of the polarized range of the excitation region along the length direction of the piezoelectric ceramic substrate 2 is represented by a polarized range $L_p$. A change in characteristics due to a change in the electrode-overlapping length $L_e$ is determined while setting the length L of the piezoelectric ceramic substrate to 2.2 mm, fixing the polarized range $L_p$ to 1.2 mm, and changing the electrode-overlapping length $L_e$. FIGS. 8 and 9 show the results.

FIG. 8 shows the relationship between ratios $L_e/L_p$ and $\Delta Z/\Delta Z_{max}$ indicating the trapping efficiency of the third harmonic overtone of the thickness shear mode. The ratio $L_e/L_p$ on the horizontal axis is a value depending on the electrode-overlapping length $L_e$. Additionally, $\Delta Z/\Delta Z_{max}$ on the vertical axis represents the ratio of an amount of displacement $\Delta Z$ at a length-direction end of the piezoelectric ceramic substrate 2 to a maximum amount of displacement $\Delta Z_{max}$ of the excitation region determined from the analysis using the finite element method.

In addition, FIG. 9 shows the relationship between the ratios $L_e/L_p$ and $\Delta F/Fa(\%)$, where Fa represents an anti-resonant frequency and $\Delta F$ represents a difference between the resonant frequency and the anti-resonant frequency. Thus, $\Delta F/Fa$ represents a bandwidth ratio.

As is clear from FIG. 8, when the ratio $L_e/L_p$ is set approximately to 0.8-1.0, the trapping efficiency of the third harmonic overtone is the most preferable and the bandwidth ratio shows the maximum at the ratio $L_e/L_p$ approximately equal to 0.9. Thus, preferably, the electrode-overlapping length $L_e$ is preferably set to 0.8-fold to 1.0-fold of the length-directional length of the polarized range, and, more preferably, approximately to 0.9-fold thereof.

Figure 10:
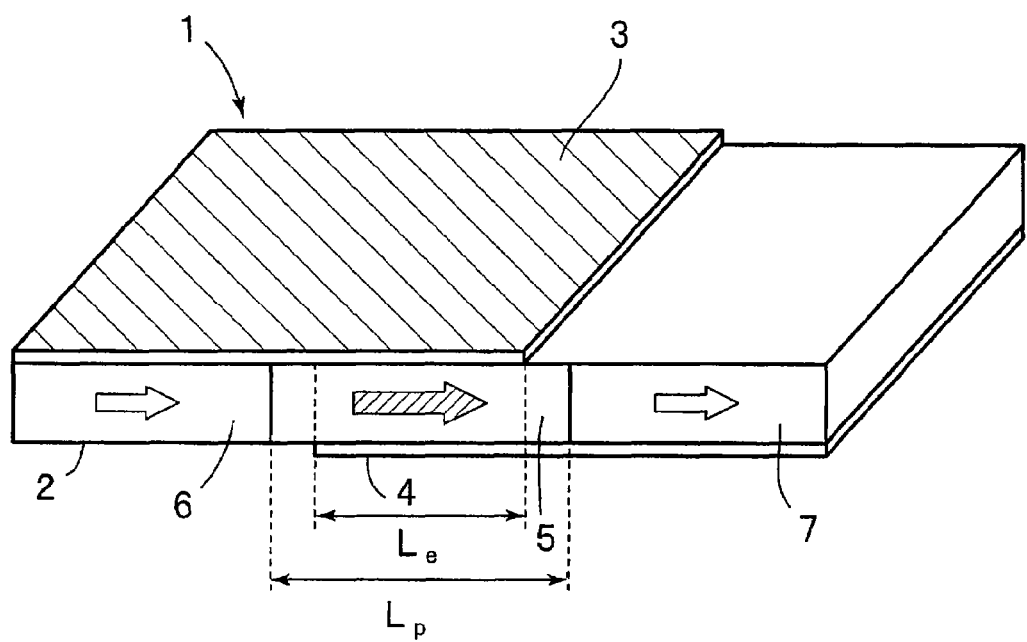
FIG. 10 is a perspective view schematically showing a relationship between an excitation-electrode-overlapping length and a polarized range in a first embodiment.
Figure 11:
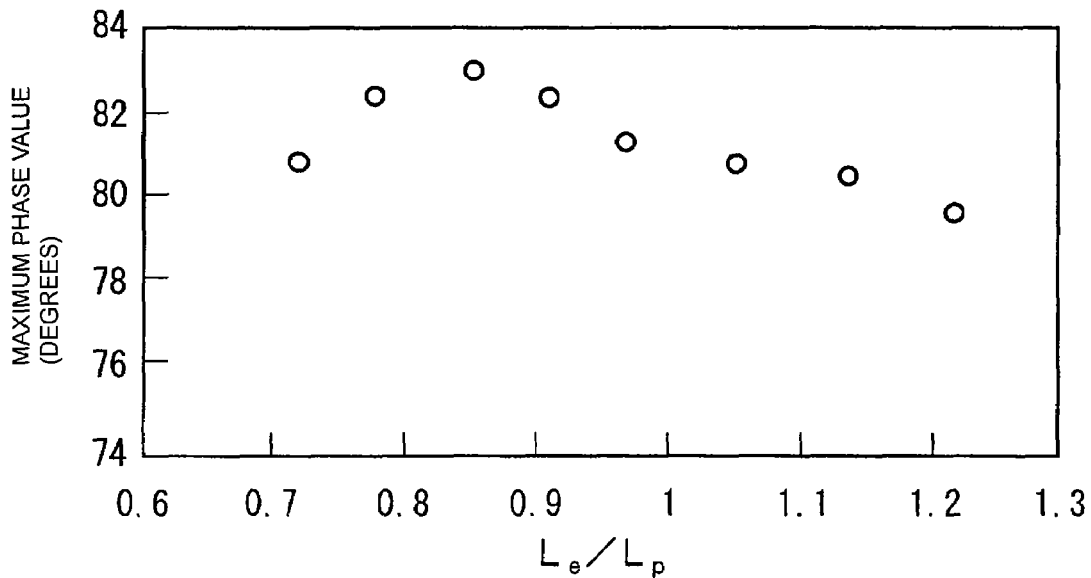
FIG. 11 is a diagram showing a relationship between an excitation-electrode-overlapping length and a maximum phase value.

A piezoelectric vibrator was test-manufactured on the basis of the above-described simulation. FIG. 10 schematically shows a perspective view of the test-manufactured piezoelectric vibrator 1. In addition, FIG. 11 shows the relationship between the ratio $L_e/L_p$ and the maximum phase value of the third harmonic overtone actually measured in the test-manufactured piezoelectric vibrator 1. It is seen that the maximum phase value shows a maximum at the ratio $L_e/L_p$ substantially equal to 0.9 and shows larger values in a range of 0.8-1.0. That is, it is seen that the above-described simulation result matches the experiment result of an actually test-manufactured device.

Figure 12:
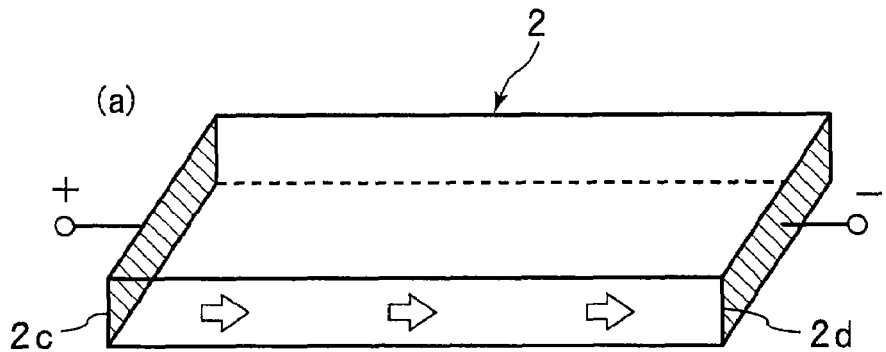
FIGS. 12(a) and (b) are perspective views for illustrating a first example of a polarization method for obtaining a polarization structure of a piezoelectric ceramic substrate of a first embodiment.
Figure 12:
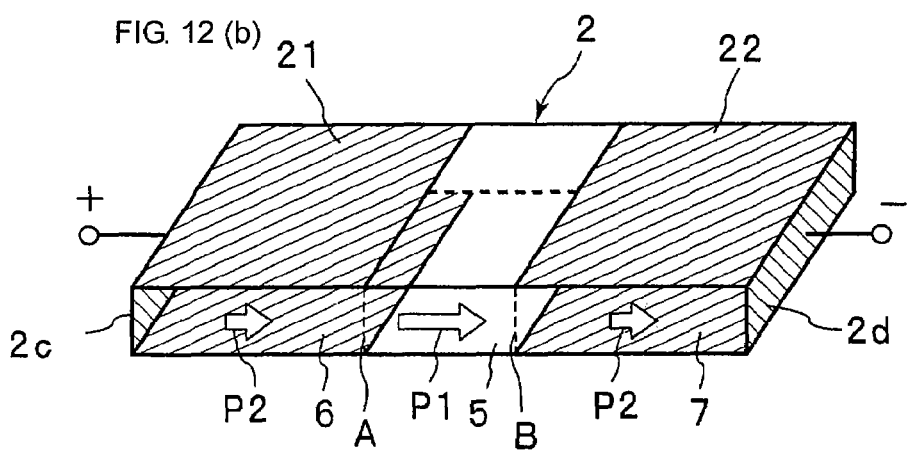

Meanwhile, the polarization method for forming the excitation region 5 and the non-excitation regions 6 and 7 is not limited particularly to a manner of the above-described embodiment. An example will be described with reference to FIGS. 12(a) and (b). As shown in FIG. 12(a), direct voltage is first applied across the end faces 2c and 2d of the piezoelectric ceramic substrate 2 so that the piezoelectric ceramic substrate 2 is uniformly polarized in a direction parallel to the length direction thereof so as to have a relatively small polarization degree. The arrows in FIG. 12(a) indicate the polarization direction.

As shown in FIG. 12(b), polarization electrodes 21 and 22 are then formed. The polarization electrodes 21 and 22 are provided at outer surface portions of the piezoelectric ceramic substrate 2 except for a portion where the excitation region 5 is provided. More specifically, the polarization electrode 21 is formed on the side of the end face 2c, whereas the polarization electrode 22 is formed on the side of the end face 2d. Accordingly, the polarization degree of the excitation region 5 is increased by applying the direct voltage across the polarization electrodes 21 and 22. In this manner, a piezoelectric ceramic substrate 2 whose the excitation region 5 is polarized to have the same polarization axis direction as the non-excitation regions 6 and 7 and s relatively high polarization degree can be obtained.

Figure 13:
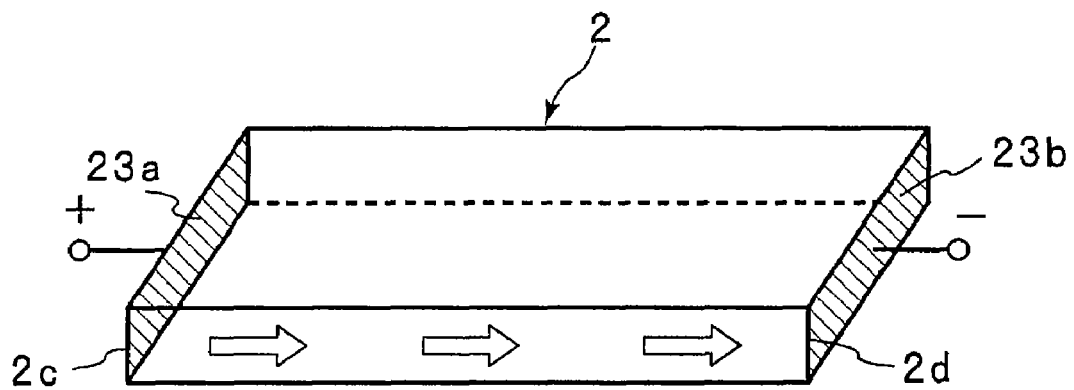
FIGS. 13(a) and (b) are perspective views for illustrating a second example of a polarization method for obtaining a polarization structure of a piezoelectric ceramic substrate of a first embodiment.
Figure 13:
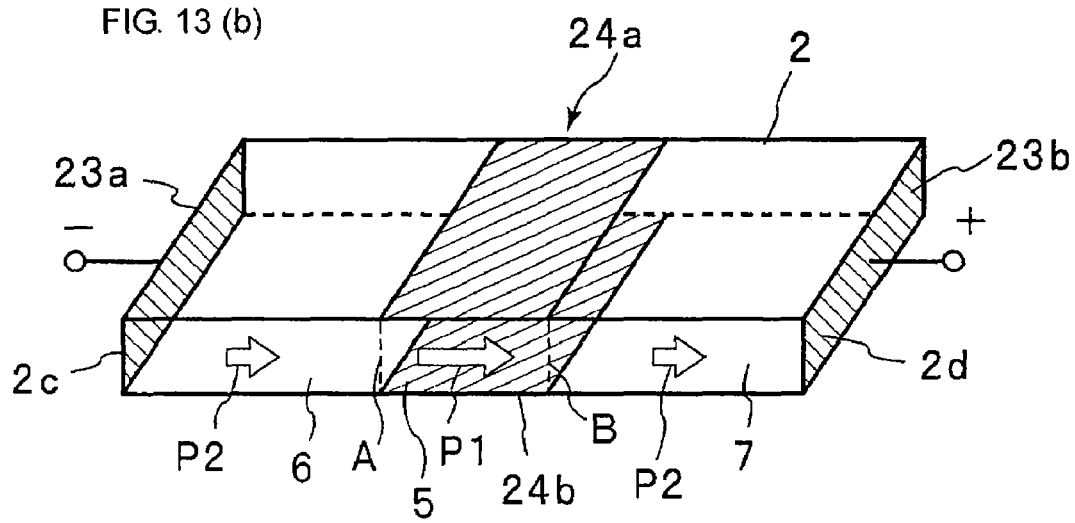

FIGS. 13(a) and (b) are perspective views for illustrating another method for obtaining the above-described polarization structure. As shown in FIG. 13(a), direct voltage is first applied in this polarization method across polarization electrodes 23a and 23b provided at end faces 2c and 2d to polarize the entire piezoelectric ceramic substrate 2 in the length direction of the piezoelectric ceramic substrate 2. In this case, the polarization degree is set relatively high.

As shown in FIG. 13(b), electrodes 24a and 24b are formed after a predetermined time on first and second principal surfaces 2a and 2b at a portion where the excitation region 5 of the piezoelectric ceramic substrate 2 is provided. Furthermore, a direct voltage is applied to the polarization electrodes 23a and 23b while keeping the electrodes 24a and 24b in a state of floating electrodes not connected to a ground so that the polarity becomes opposite to that of the previous polarization. Since the electric field is not applied to the portions of the piezoelectric ceramic substrate around the electrodes 24a and 24b at this time, a polarization voltage of the opposite direction is applied only to the non-excitation regions 6 and 7, which lowers the polarization degree of the non-excitation regions 6 and 7. In this manner, the polarization degree of the excitation region 5 can be set higher than that of the non-excitation regions 6 and 7.

Figure 14:
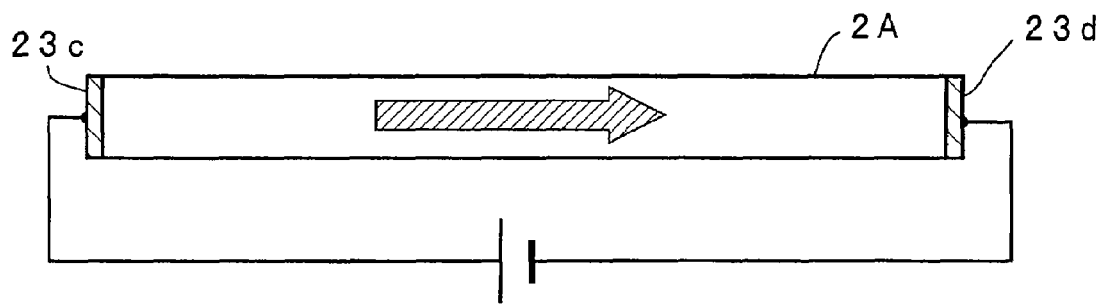
FIGS. 14(a)-(c) are schematic elevational sectional views for illustrating a third example of a polarization method for obtaining a polarization structure of a piezoelectric ceramic substrate of a first embodiment.
Figure 14:
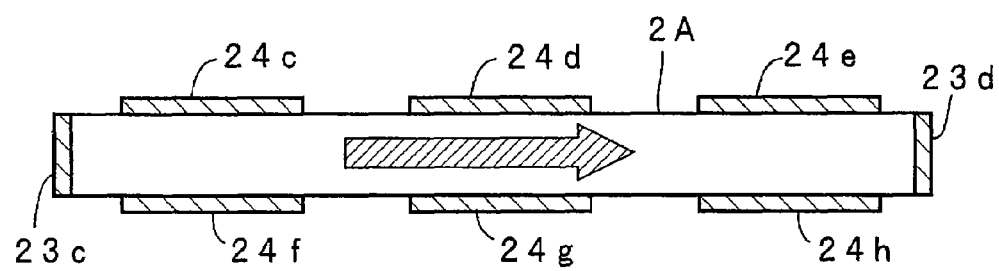
Figure 14:
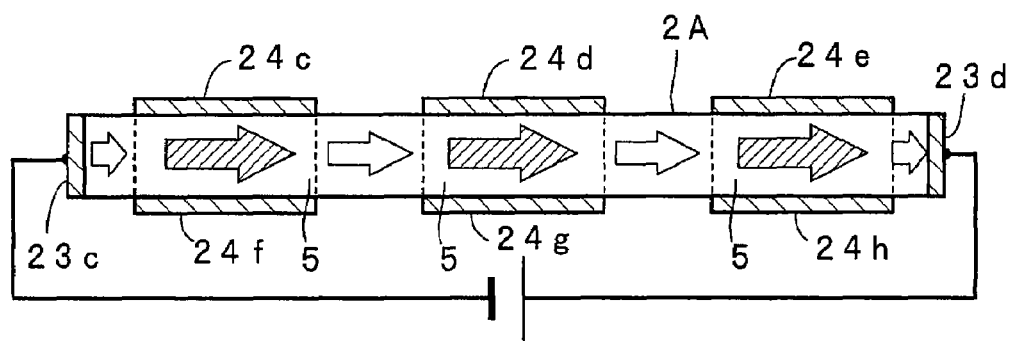
Figure 15:
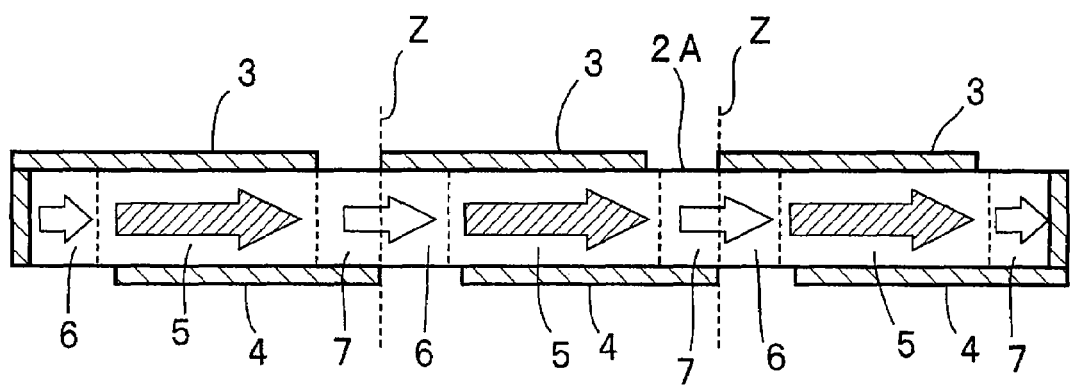
FIGS. 15(a) and (b) are schematic elevational sectional views for illustrating a third example of a polarization method for obtaining a polarization structure of a piezoelectric ceramic substrate of a first embodiment.
Figure 15:
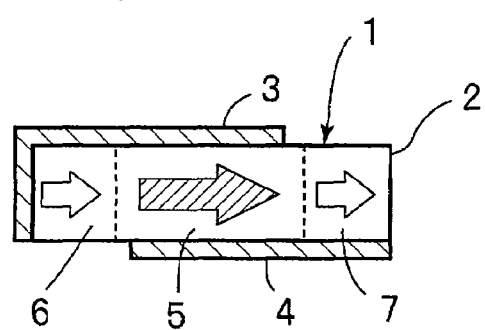

FIGS. 14(a) to (c) and FIGS. 15(a) and (b) are schematic elevational sectional views for illustrating a third example of the polarization method. As shown in FIG. 14(a), a mother piezoelectric ceramic substrate 2A is polarized in the length direction using polarization electrodes 23c and 23d provided at respective end faces to have a large polarization degree in a first polarization step. Meanwhile, as in the case of FIG. 7 to FIG. 10, hatching has been added to an arrow indicating the polarization direction of a relatively high polarization degree in FIG. 14 to FIG. 17. Polarization for a relatively low polarization degree is referred to as control polarization and the direction thereof is indicated by an arrow without hatching.

As shown in FIG. 14(b), a plurality of floating electrodes 24c-24e and floating electrodes 24f-24h provided to face the floating electrodes 24c-24e are then formed at excitation-region-formed portions of an upper face and a lower face of the mother ceramic substrate 2A, respectively.

As shown in FIG. 14(c), the piezoelectric ceramic substrate 2A is polarized after a predetermined time in a direction opposite to the first polarization direction using the polarization electrodes 23c and 23d provided at the respective end faces at a second polarization step so as to polarize the non-excitation regions 6 and 7. More specifically, at the portions where the floating electrodes 24c-24e and 24f-24h are provided, the current does not flow through the ceramic but flows through the floating electrodes 24c-24e and 24f-24h having a relatively low resistance at the time of polarization. Thus, the electric field is not applied to the ceramic portion existing under the floating electrodes and the polarization degree does not change. In contrast, since an electric field is caused at the both ends of the non-excitation regions 6 and 7 where the flowing electrodes 24c-24e and the floating electrodes 24f-24h do not face each other, this region is oppositely polarized and the polarization degree decreases. This polarization state with the decreased polarization degree is referred to as the control polarization described before.

As shown in FIG. 15(a), first and second excitation electrodes 3 and 4 extending from the excitation region to the non-excitation region are formed after a predetermined time. At this time, the excitation electrodes 3 and 4 may be formed after removing the above-described floating electrodes 24c-24h or the excitation electrodes 3 and 4 may be formed by forming electrode films to cover the floating electrodes 24c-24h. By cutting the mother piezoelectric ceramic substrate 2A at the broken lines Z, individual piezoelectric vibrators shown in FIG. 15(b) can be obtained.

FIGS. 16(a) to (d) are schematic elevational sectional views illustrating a fourth polarization method. As shown in FIG. 16(a), the direct voltage is applied to polarization electrodes 23c and 23d provided on respective end faces to polarize a mother piezoelectric ceramic substrate 2A in the length direction in a first polarization step, as in the case of FIG. 14(a). However, the polarization in this case is performed to create the control polarization state, i.e., to have a relatively low polarization degree.

As shown in FIG. 16(b), a plurality of floating electrodes 24i and 24j and floating electrodes 24k and 24l are then formed on an upper face and a lower face of the mother piezoelectric ceramic substrate 2A, respectively. The floating electrodes 24k and 24l are provided to face the floating electrodes 24i and 24j. In addition, electrode extending portions 23e and 23f are formed to be connected to polarization electrodes 23c and 23d and to reach the non-excitation regions. As shown in FIG. 16(c), voltage is further applied across the polarization electrodes 23c and 23d in the same direction as that of the control polarization after a predetermined time to carry out a second polarization step. This increases the polarization degree at regions except for the region where the floating electrodes 24i, 24j, 24k, and 24l are provided and the region where the electrode extending portions 23e and 23f are provided. That is, the polarization state is brought into a fully polarized state indicated by arrows with hatching.

Figure 16:
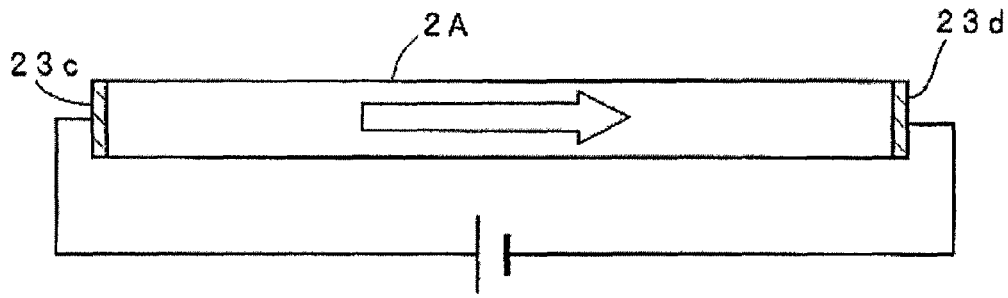
FIGS. 16(a)-(d) are schematic elevational sectional views for illustrating a fourth example of a polarization method for obtaining a polarization structure of a piezoelectric ceramic substrate of a first embodiment.
Figure 16:
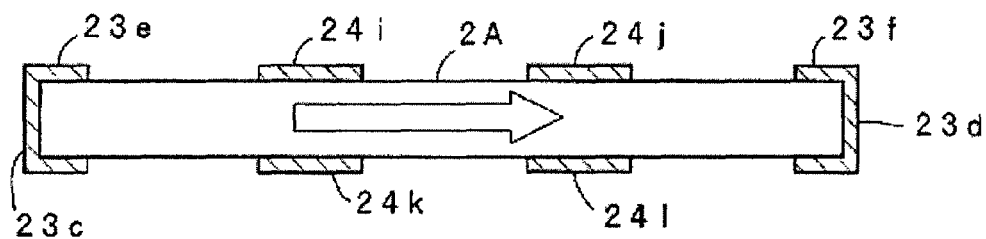
Figure 16:
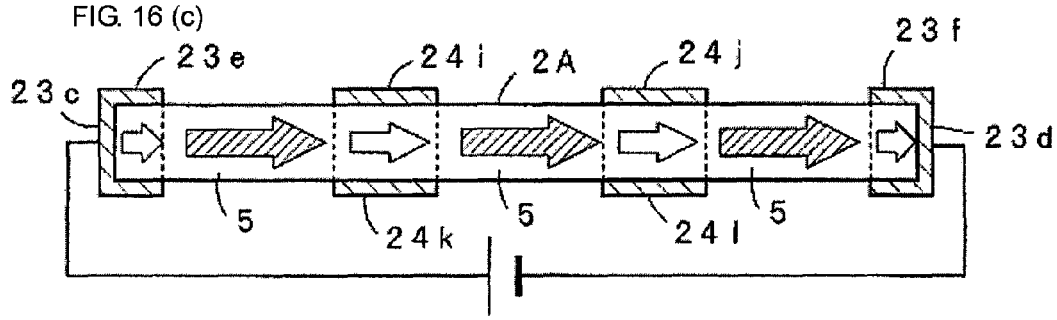
Figure 16:
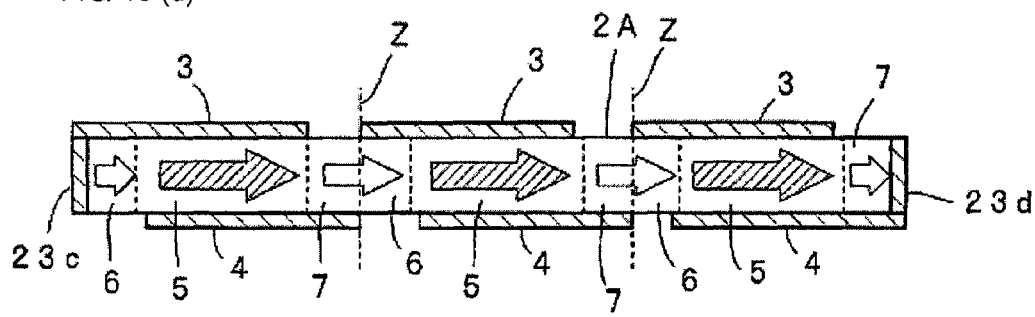

In this manner, the polarization degree of the excitation region 5 is increased and the non-excitation regions 6 and 7 are set in the control polarization state where the polarization degree is relatively low. By forming excitation electrodes 3 and 4 and cutting the mother ceramic substrate 2A at points shown by broken lines Z after a predetermined time, as shown in FIG. 16(*d*), individual piezoelectric vibrators 1 can be obtained, as in the case of the third method.

Figure 17:
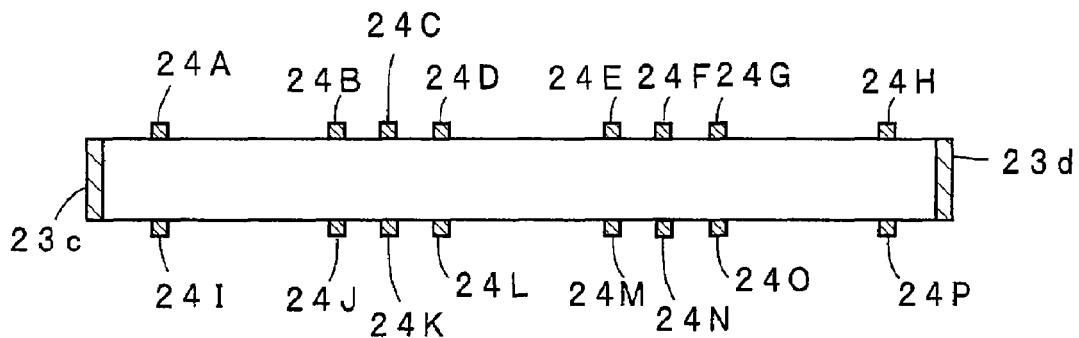
FIGS. 17(a)-(d) are schematic elevational sectional views for illustrating a fifth example of a polarization method for obtaining a polarization structure of a piezoelectric ceramic substrate of a first embodiment.
Figure 17:
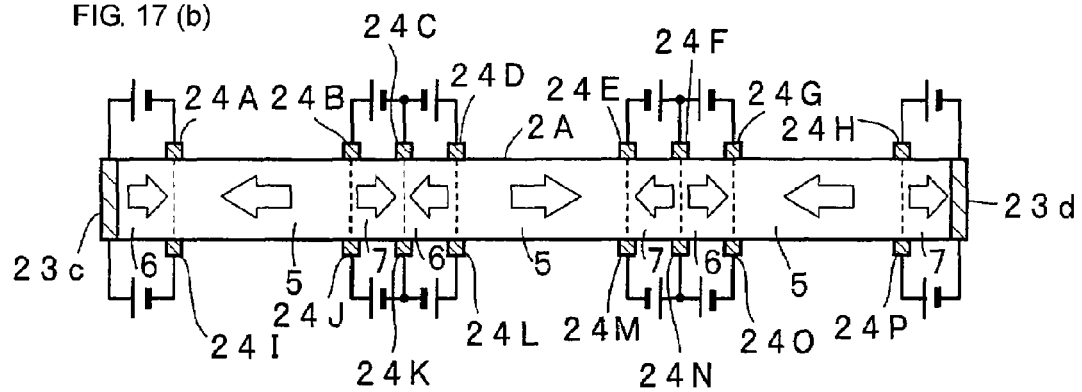
Figure 17:
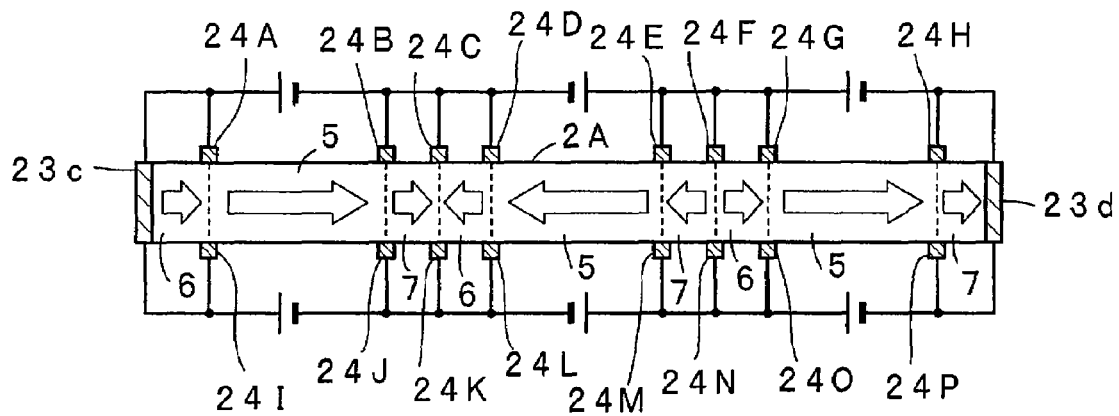
Figure 17:
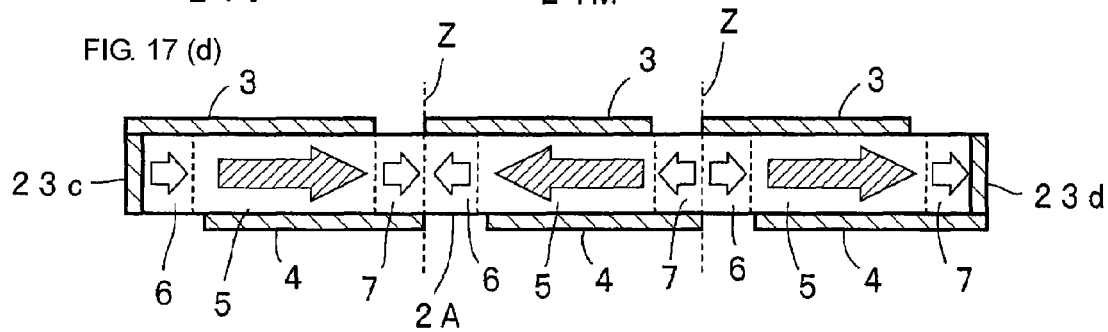

FIGS. 17(*a*) to (*d*) are schematic elevational sectional views for illustrating a fifth polarization method. In this method, polarization electrodes 23*c* and 23*d* and floating electrodes 24A-24H and 24I-24P are first formed on a mother piezoelectric ceramic substrate 2A. The floating electrodes 24A-24H and the floating electrodes 24I-24P are provided at positions where they face each other through the mother piezoelectric ceramic substrate 2A. In addition, portions where the floating electrodes 24A-24H and 24I-24P are provided are positions where the polarization states at both sides thereof ultimately differ in the length direction of the mother ceramic substrate 2A.

As shown in FIG. 17(*b*), the direct voltage is then applied to polarize the mother ceramic substrate 2A in a first polarization step. The non-polarization regions 6 and 7 of the mother ceramic substrate 2A are brought into the control polarization state. In addition, the excitation region 5 between the non-excitation regions 6 and 7 is polarized so as to be in the control polarization state.

As shown in FIG. 17(*c*), the polarization electrodes 23*c* and 23*d* and the floating electrodes 24A-24H and 24I-24P are then connected to the power source to apply the voltage so that a polarization voltage is further applied to the excitation region. In this manner, the substrate is polarized so that the polarization degree of the excitation region of a single piezoelectric vibrator is further increased, for example, and is brought into the fully polarized state in a second polarization step. For example, the floating electrodes 24A and 24B are located on the respective sides of the excitation region 5 of a single piezoelectric vibrator. Voltage is applied across the floating electrode 24A and the floating electrode 24B. Similarly, on the lower face, voltage is applied across the floating electrode 24I and the floating electrode 24J. Meanwhile, since the polarization electrode 23*c* is connected to the floating electrodes 24A and 24I, voltage is not applied to the non-excitation region 6 on the left and the control polarization state is maintained. Similarly, since the floating electrodes 24B-24D and the floating electrodes 24J-24L are at the same potential and the polarization voltage is not applied thereacross, the control polarization state is maintained.

As shown in FIG. 17(*d*), by forming excitation electrodes 3 and 4 and cutting the piezoelectric ceramic substrate 2A at points indicated by broken lines Z after a predetermined time, individual piezoelectric vibrators 1 can be obtained as in the case of the third method.

Figure 18:
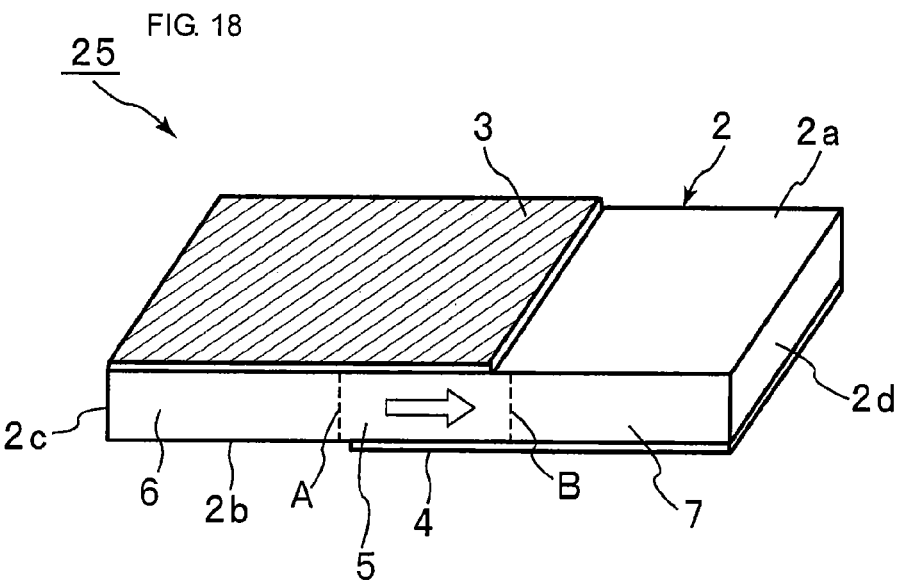
FIG. 18 is a perspective view showing a piezoelectric vibrator of a second embodiment.

FIG. 18 is a perspective view showing a piezoelectric vibrator according to a second embodiment of the present invention. A piezoelectric vibrator 25 is configured in the same manner as that of the piezoelectric vibrator 1 of the first embodiment except for having a different polarization structure. Accordingly, the same reference numerals are attached to the same portions and the description thereof is omitted.

In this embodiment, the excitation region 5 of the piezoelectric ceramic substrate 2 is polarized in the length direction of the piezoelectric ceramic substrate 2. However, non-excitation regions 6 and 7, i.e., regions other than the excitation region 5, are not polarized.

Figure 19:
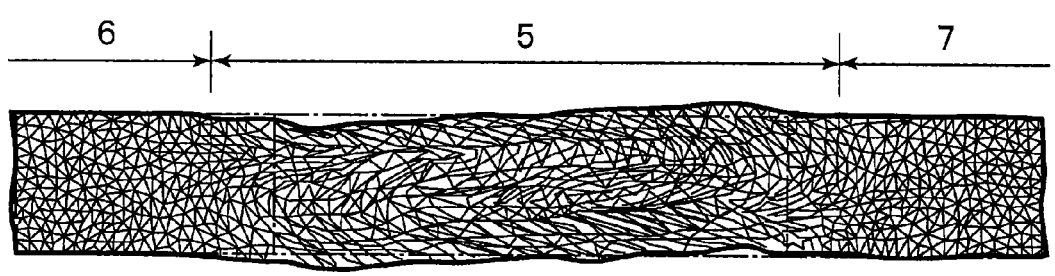
FIG. 19 is an elevational sectional view schematically showing a displacement distribution of a piezoelectric ceramic substrate 2 analyzed using a finite element method when a third harmonic overtone of a thickness shear mode is excited in a piezoelectric vibrator of a second embodiment.

As in the case of the first embodiment, the third harmonic overtone of the thickness shear mode is excited in response to application of alternating voltage to excitation electrodes 3 and 4 and is trapped in the excitation region 5 in the piezoelectric vibrator 25 of this embodiment. FIG. 19 shows the displacement distribution of a driven state of this piezoelectric vibrator 25 analyzed using a finite element method.

As is clear from FIG. 19, the excitation region 5 displaces, whereas the non-excitation regions 6 and 7 hardly displace.

The effect of the polarization degree of the non-excitation regions onto characteristics of the piezoelectric vibrator will now be described. First, FIGS. 5 and 6 show a resonance characteristic of a piezoelectric vibrator obtained by applying an electric field of 2.0 kV/mm at 60° C. for 30 minutes to polarize the non-excitation regions and applying an electric field of 4.0 kV/mm at 80° C. for 30 minutes to polarize the excitation region and a resonance characteristic of a piezoelectric vibrator obtained by polarizing the whole region on the same polarization condition as that of the above-described excitation region. As shown in FIG. 6, it is seen that no spurious vibration is observed around the main resonance characteristic to be utilized and a preferable resonance characteristic is obtained when the polarization voltage of the non-excitation regions is set lower than that of the excitation region.

On the other hand, it is seen that the main resonance characteristic to be utilized is weak and many spurious vibration appears therearound when the whole region is polarized at the same polarization voltage, as shown in FIG. 5.

Figure 20:
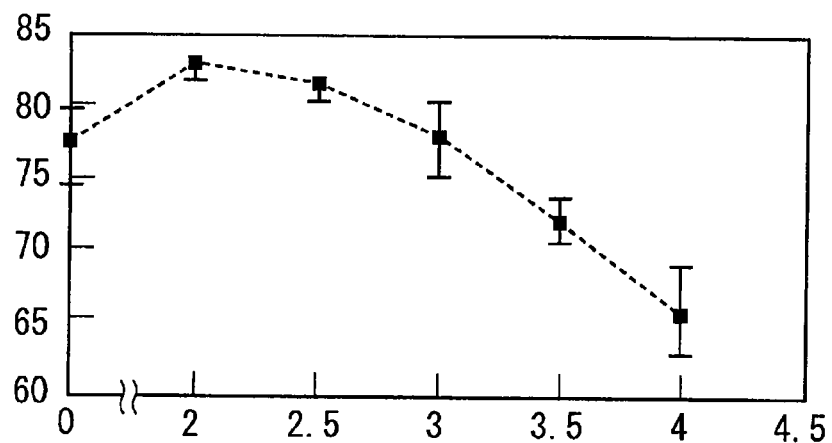
FIG. 20 is a diagram showing a relationship between a polarization voltage and a maximum phase value of a third harmonic overtone of a piezoelectric vibrator.

FIG. 20 shows the maximum phase value of the third harmonic overtone of the piezoelectric vibrator measured in a same manner as the case of FIG. 6 except for fixing the polarization voltage of the excitation region to 4.0 kV/mm and changing the polarization voltage of the non-excitation regions within a range of 0-4.0 kV/mm. As is clear from FIG. 20, when the polarization voltage of the non-excitation regions is 2.0 kV/mm, the phase value is the maximum value. If the polarization voltage becomes higher than that, the maximum phase value decreases. In addition, the maximum phase value becomes low when the non-excitation regions are not polarized. Accordingly, preferably, it is desirable that the non-excitation regions are polarized at an appropriate polarization degree.

Figure 21:
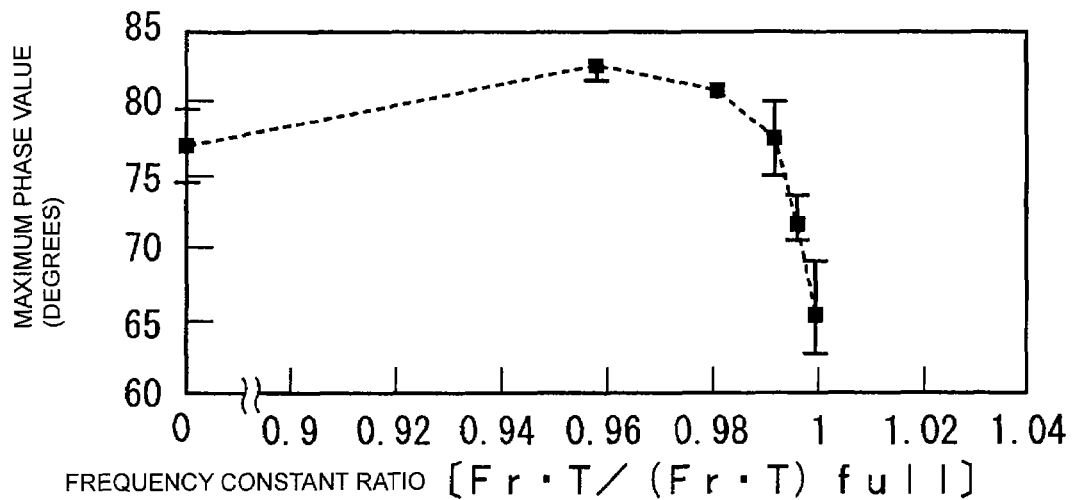
FIG. 21 is a diagram showing a relationship between a frequency constant ratio and a maximum phase value of a third harmonic overtone of a thickness shear mode.

FIG. 21 is a diagram where the polarization voltage of the horizontal axis of FIG. 20 is replaced by the frequency constant ratio. Here, the frequency constant ratio is a frequency constant normalized by the frequency constant of a result of polarization at 4.0 kV/mm, i.e., a result of the full polarization.

Figure 22:
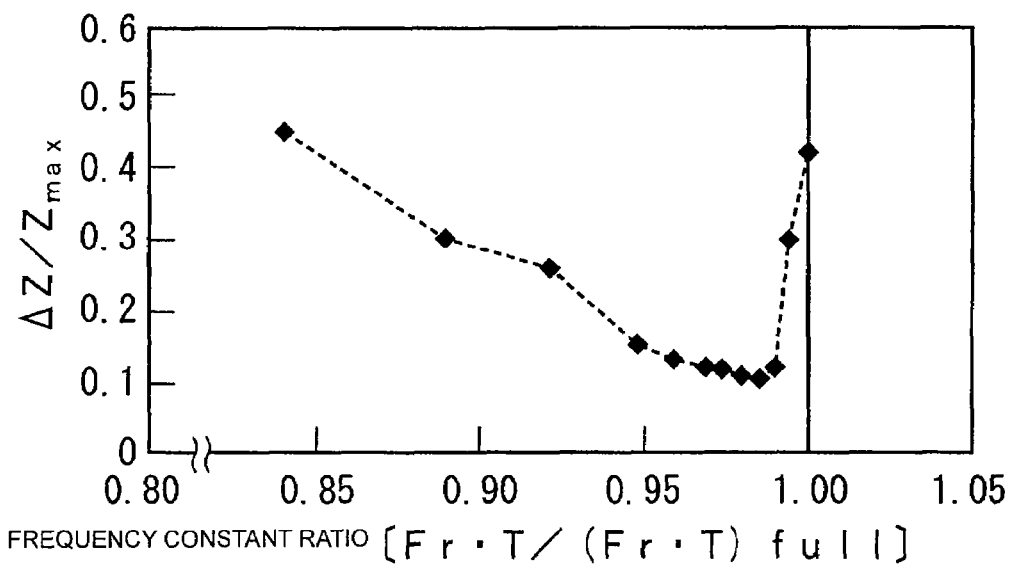
FIG. 22 is a diagram showing a relationship between a frequency constant ratio and a third-harmonic-overtone vibration trapping efficiency.

In addition, FIG. 22 is a diagram where the Young's modulus ratio of the horizontal axis of FIG. 32, which will be described below, is replaced by the frequency constant ratio for comparison. Here, the frequency constant ratio is determined by calculating the frequency constant of the non-excitation regions backward at a constant density.

Comparison of FIG. 21 and FIG. 22 reveals that the result is preferable around the frequency constant ratio of 0.96-0.98 in any case and it is known that the analysis result using the finite element method matches the experiment result.

Figure 23:
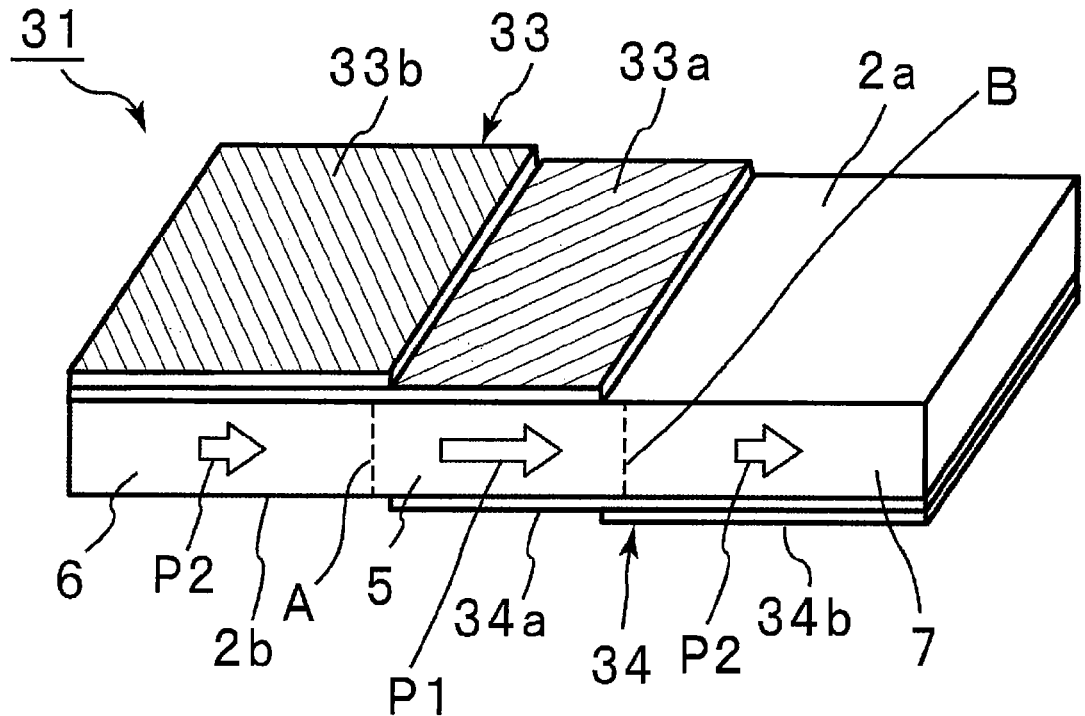
FIG. 23 is a perspective view of a piezoelectric vibrator according to a third embodiment of the present invention.

FIG. 23 is a perspective view showing a piezoelectric vibrator according to a third embodiment of the present invention. In a piezoelectric vibrator 31 according to the third embodiment, first and second excitation electrodes 33 and 34 are formed on an upper face 2*a* and a lower face 2*b* of a piezoelectric ceramic substrate 2, respectively. A difference from the first embodiment is that thickness of part of the excitation electrodes 33 and 34 has been made relatively thick. More specifically, the excitation electrodes 33 and 34 have electrode film portions 33a and 34a located on an excitation region 5 and electrode film portions 33b and 34b located on non-excitation regions 6 and 7. Electrode film portions 33b and 34b are laminated on electrode film portions 33a and 34a. Accordingly, the second layer electrode film in the layered films corresponds to a dummy electrode of the present invention. The thickness of the electrode film portions 33b and 34b is made thicker than the electrode film portions 33a and 34a. Other points of the piezoelectric vibrator 31 are configured in the same manner as that of the piezoelectric vibrator 1.

The frequency constant of the non-excitation regions can be lowered by forming relatively thick dummy electrodes at the non-excitation regions. Accordingly, an effect equivalent to that obtained by relatively lowering the Young's modulus at the non-excitation regions is further increased by the formation of the dummy electrodes, which allows vibration energy of the third harmonic overtone to be trapped in the excitation region more effectively and can suppress the spurious vibration more effectively.

A similar effect may be obtained by laminating another member for adding the weight on the non-excitation regions 6 and 7 instead of the method for increasing the thickness of the excitation electrodes.

Figure 24:
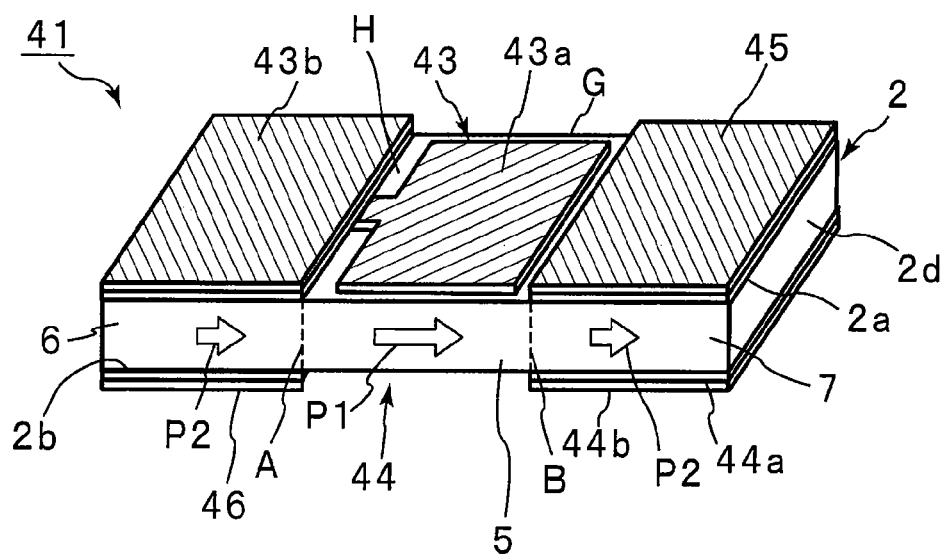
FIG. 24 is a perspective view showing a piezoelectric vibrator according to an alternative example of a third embodiment.

FIG. 24 is a perspective view showing an alternative example of the piezoelectric vibrator of the third embodiment. In this alternative example, an excitation electrode 43 is not formed over all of the excitation region 5. More specifically, an electrode film portion 43a of the excitation electrode 43 located on the excitation region 5 is arranged distant from edges located at both width-direction ends of the piezoelectric ceramic substrate 2 by a gap G. That is, the excitation electrode 43 does not reach the width-direction ends at the excitation region 5. In addition, although a portion between broken lines A and B is polarized at a relatively high polarization degree, the electrode film portion 43a of the excitation electrode 43 is not provided over the entire length of the excitation region 5 with the relatively high polarization degree in the length direction of the piezoelectric ceramic substrate 2. More specifically, the electrode film portion 43a of the excitation electrode 43 is arranged apart from the broken lines A and B by a gap H. A second excitation electrode 44 provided on the lower face 2b is configured in the similar manner.

Although the piezoelectric vibration portion is defined as a portion where the first and second excitation electrodes overlap through the piezoelectric ceramic substrate 2, an excitation region 5 with the relatively high polarization degree only has to be a region including at least the piezoelectric vibration portion and the excitation electrode does not have be formed all over the region with the relatively high polarization degree.

More specifically, the region with the relatively high polarization degree shows a high piezoelectric effect. Accordingly, when alternating voltage is applied to the excitation electrodes 43 and 44, the third harmonic overtone is intensely excited by the piezoelectric effect at an area around the portion where the electrode film portions 43a, 44a of the excitation electrodes 43 and 44 overlap through the piezoelectric ceramic substrate 2 and is trapped in the region sandwiched by the broken lines A and B. Thus, the excitation region, namely, the piezoelectric vibration portion, broadly includes a portion positively excited by the piezoelectric effect when the alternating voltage is applied across the first and second excitation electrodes.

As described above, a region between the broken lines A and B corresponds to the excitation region 5 in FIG. 24, whereas the non-excitation regions 6 and 7 neighboring the piezoelectric vibration portion correspond to regions on outer sides of the broken lines A and B.

Meanwhile, as in the case of the piezoelectric vibrator 31, the electrode film portions 43b and 44b are constituted by a plurality of layered electrode films and are made thicker than the electrode film portions 43a and 44a of the excitation region 5 in the piezoelectric vibrator 41. A dummy electrode 45 is formed at the non-excitation region 7 of the upper face 2a of the piezoelectric ceramic substrate 2. The dummy electrode 45 is configured in the same manner as the electrode film portion 43b. A dummy electrode 46 is formed at the non-excitation region 6 of the lower face of the piezoelectric ceramic substrate 2. The dummy electrode 46 is constituted in the same manner as the electrode film portion 44b. Accordingly, in this alternative example, the frequency constant of the non-excitation regions is lowered by the effect of adding the weight of the dummy electrodes 45 and 46 to the non-excitation regions 6 and 7 and the vibration energy of the third harmonic overtone is trapped more effectively and the spurious vibrations can be suppressed. The dummy electrodes may be formed all over the non-excitation regions in this manner. Needless to say, the dummy electrodes may be formed at least one side of the non-excitation regions 6 and 7 as in the case of the dummy electrode laminated as the second electrode film layer in the electrode film portions 33b and 34b in the third embodiment. In addition, the dummy electrode may be partially formed at a part of the non-excitation regions.

Although the excitation region and the non-excitation regions are polarized in the above-described manner in the first to third embodiments and the alternative examples, the polarization structure can be appropriately modified in this invention as long as the excitation region is polarized in the longitudinal direction and the region of the non-excitation regions neighboring the piezoelectric vibration portion is a region having the same polarization direction and a relatively smaller absolute value of the polarization degree or an unpolarized region. FIG. 25 to FIG. 29(b) show alternative example of such a polarization structure.

Figure 25:
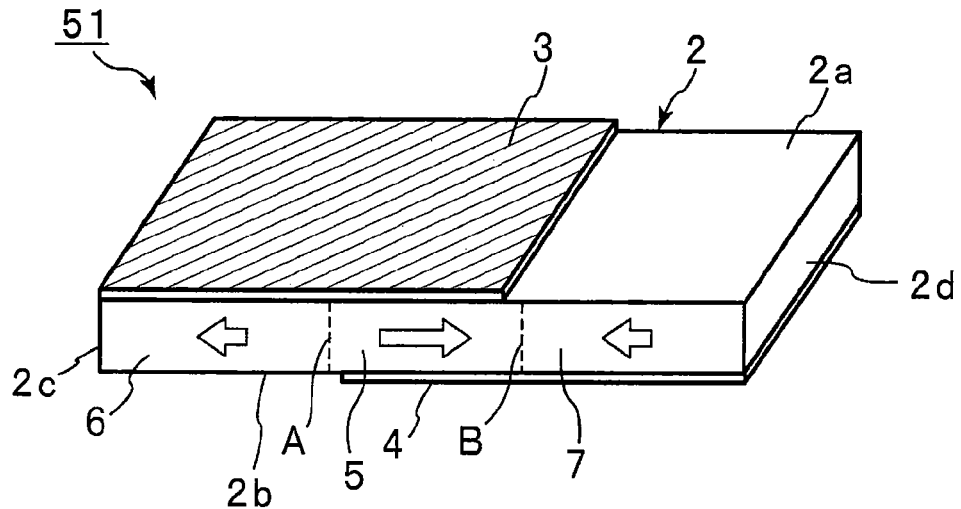
FIG. 25 is a perspective view for illustrating an alternative example of a polarization structure of a piezoelectric ceramic substrate of a piezoelectric vibrator of the present invention.
Figure 26:
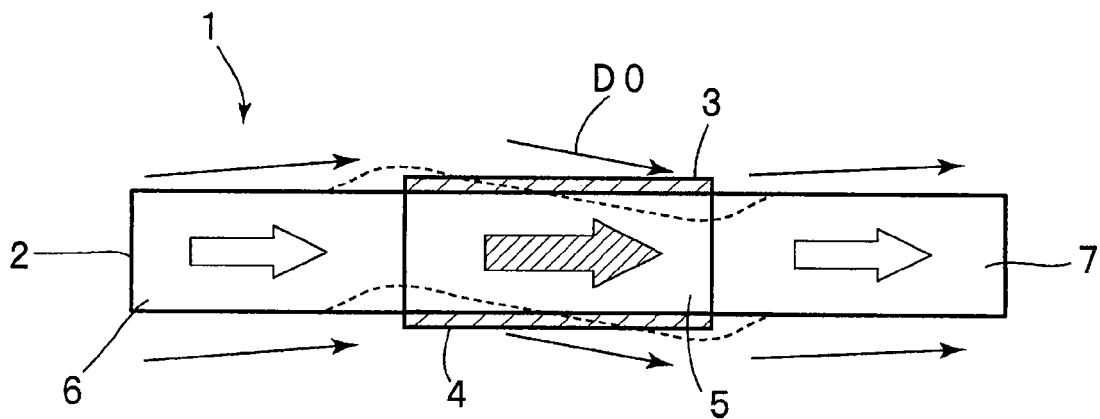
FIGS. 26(a) and (b) are elevational sectional views schematically showing vibrating states when a polarization direction of non-excitation regions and a polarization direction of an excitation region are the same and different, respectively.
Figure 26:
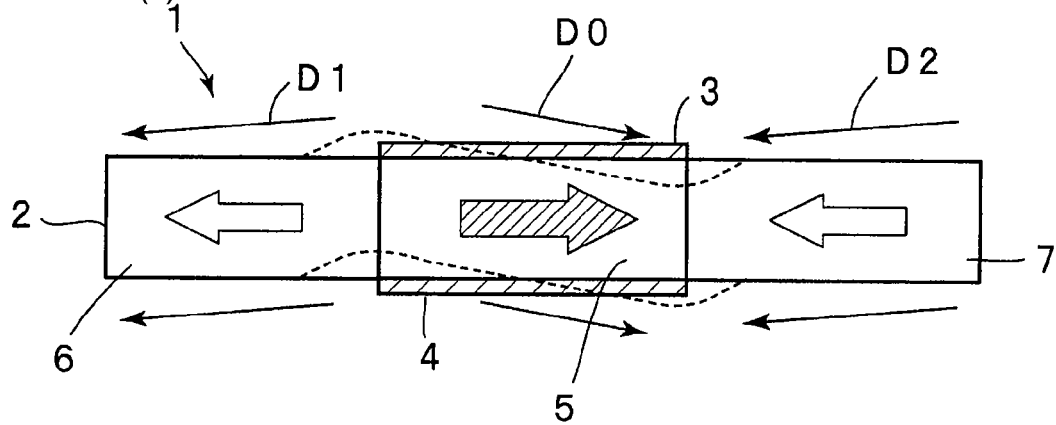

In a piezoelectric vibrator 51 of the alternative example shown in FIG. 25, the polarization degree of the non-excitation regions 6 and 7 is smaller than that of the excitation region 5 and the polarization directions are opposite. When the polarization directions are opposite, the polarization plane is the same but the direction thereof is opposite. In this manner, the polarization directions may be opposite as long as the absolute value of the polarization degree of the non-excitation regions 6 and 7 is smaller than the absolute value of the polarization degree of the excitation region 5.

FIG. 26(a) is an elevational sectional view schematically showing a displacement direction of a piezoelectric vibrator when the polarization direction of the excitation region and the polarization direction of the non-excitation regions are the same in the piezoelectric vibrator, whereas FIG. 26(b) is a diagram showing a displacement direction of a piezoelectric vibrator when the polarization direction of the excitation region and the polarization direction of the non-excitation regions are opposite.

As shown in FIG. 26(a), when the polarization axis direction of the excitation region 5 and the polarization axis direction of the non-excitation regions 6 and 7 are the same direction, displacement of the excitation region 5 in a displacing direction D0 causes the non-excitation regions 6 and 7 to displace in a similar direction. In contrast, the displacing directions of the non-excitation regions 6 and 7 in FIG. 24, i.e., displacing directions D1 and D2 shown by solid arrows, are opposite to the displacing direction D0 of the excitation region 5. In the cases of the structure of FIG. 26(b) compared to the structure of FIG. 26(a), the excitation is disturbed due to the above-mentioned reasons and the vibration efficiency worsens. Thus, even if the polarization degree of the non-excitation regions is the same, it is preferable that the polarization direction of the non-excitation regions 6 and 7 is the same as that of the excitation region 5 as shown in FIG. 26(a), which can increase the vibration trapping efficacy and the vibration characteristic.

Figure 27:
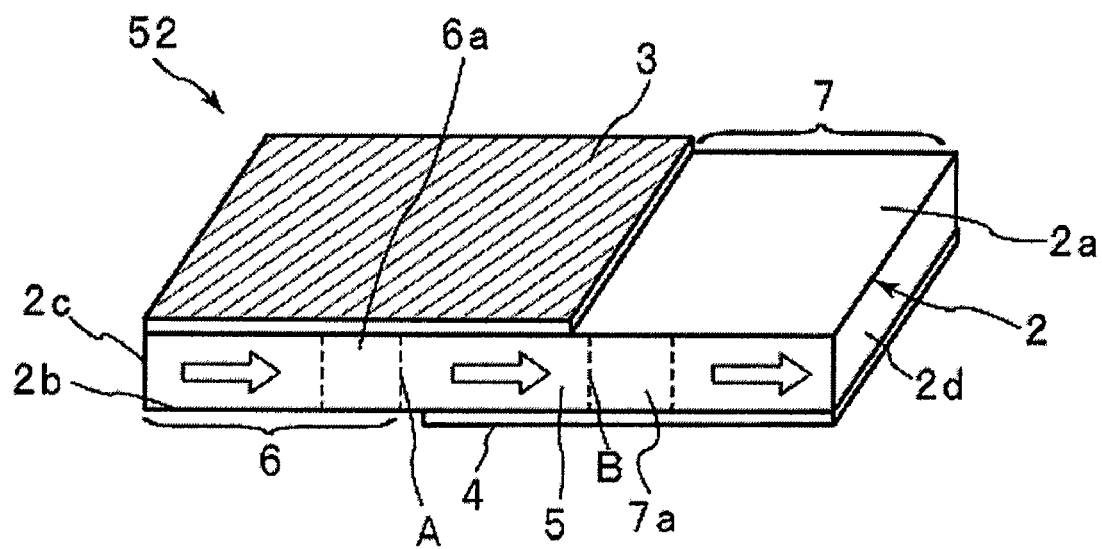
FIG. 27 is a perspective view for illustrating another alternative example of a polarization structure of a piezoelectric ceramic substrate of a piezoelectric vibrator of the present invention.

In a piezoelectric vibrator 52 shown in FIG. 27, regions 6a and 7a of non-excitation regions 6 and 7 neighboring an excitation region 5 are not polarized and the rest of the non-excitation regions 6 and 7 are polarized in the same manner as the excitation region 5.

Figure 28:
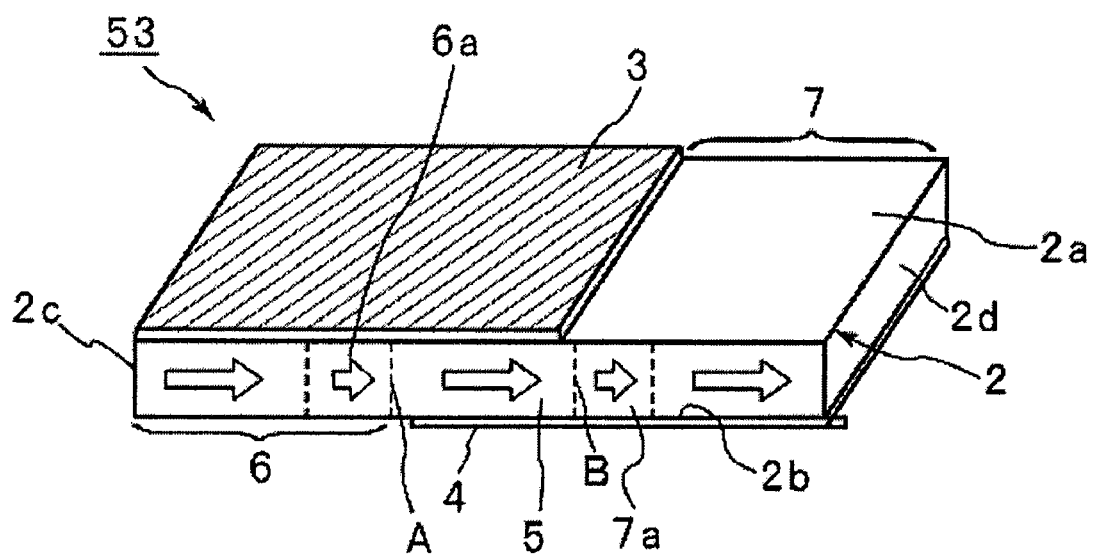
FIG. 28 is a perspective view for illustrating still another alternative example of a polarization structure of a piezoelectric ceramic substrate of a piezoelectric vibrator of the present invention.
Figure 29:
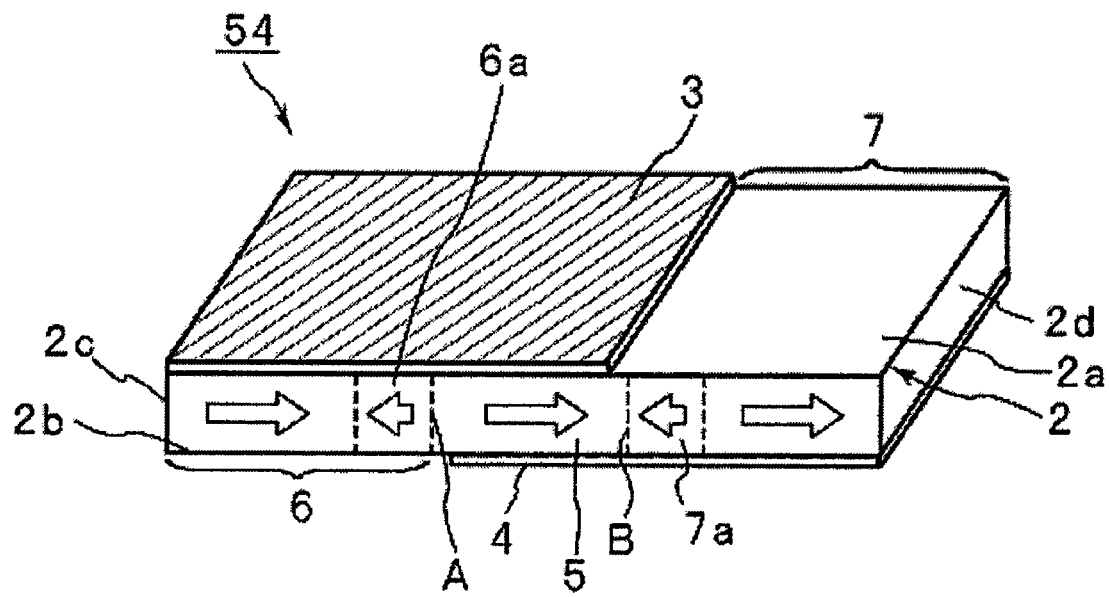
FIGS. 29(a) and (b) are perspective views for illustrating still another alternative example of a polarization structure of a piezoelectric vibrator of the present invention.
Figure 29:
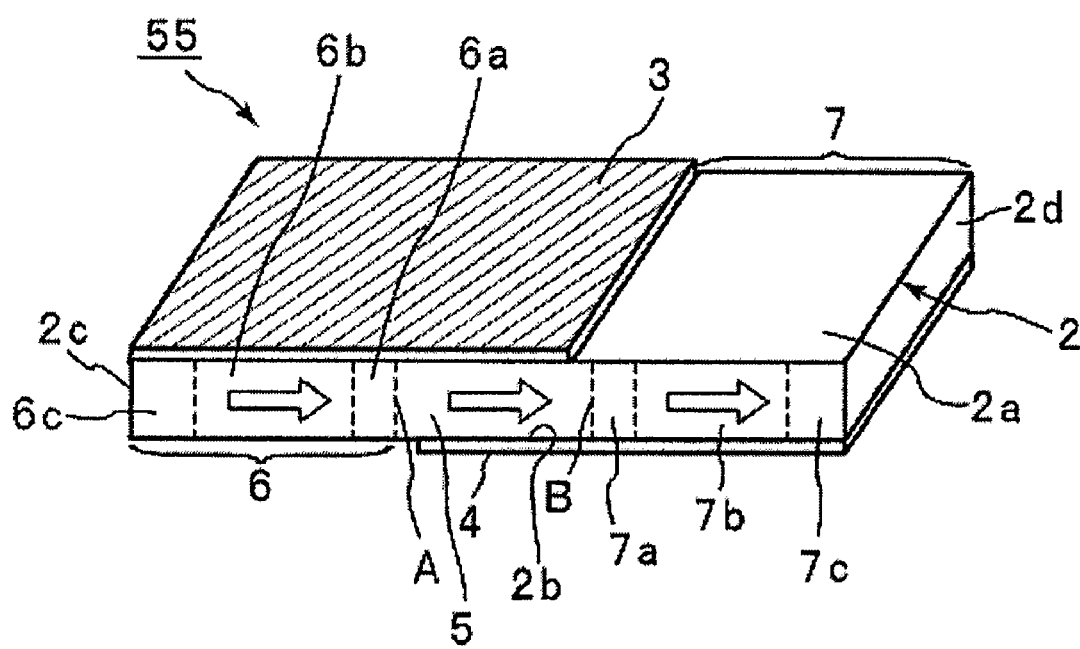

In a piezoelectric vibrator 53 shown in FIG. 28, regions 6a and 7a of non-excitation regions 6 and 7 neighboring an excitation region 5 are polarized in the same direction as the excitation region 5 but the polarization degree thereof is set smaller, unlike FIG. 27. The rest of the non-excitation regions are polarized in the same manner as the excitation region 5.

In a piezoelectric vibrator 54 shown in FIG. 29(a), the polarization directions of regions 6a and 7a of the non-excitation regions 6 and 7 neighboring an excitation region 5 are set opposite to those of FIG. 28.

In a piezoelectric vibrator 55 shown in FIG. 29(b), regions 6a and 7a of non-excitation regions 6 and 7 neighboring the excitation region 5 are not polarized and regions 6b and 7b, which are most of the rest of the non-excitation regions 6 and 7, are polarized in the same manner as the excitation region 5. However, regions 6c and 7c located at the respective ends of the piezoelectric ceramic substrate 2 are not polarized.

As described above, it is possible to provide an energy-trapping piezoelectric vibrator capable of preferably trapping the third harmonic overtone of the thickness shear mode and usable at a high frequency band, as in the case of the above-described first to third embodiments and the alternative examples, as long as regions of the non-excitation regions neighboring the piezoelectric vibration portion have a polarization degree whose absolute value is smaller than the absolute value of the polarization degree of the piezoelectric vibration portion or are not polarized.

Figure 30:
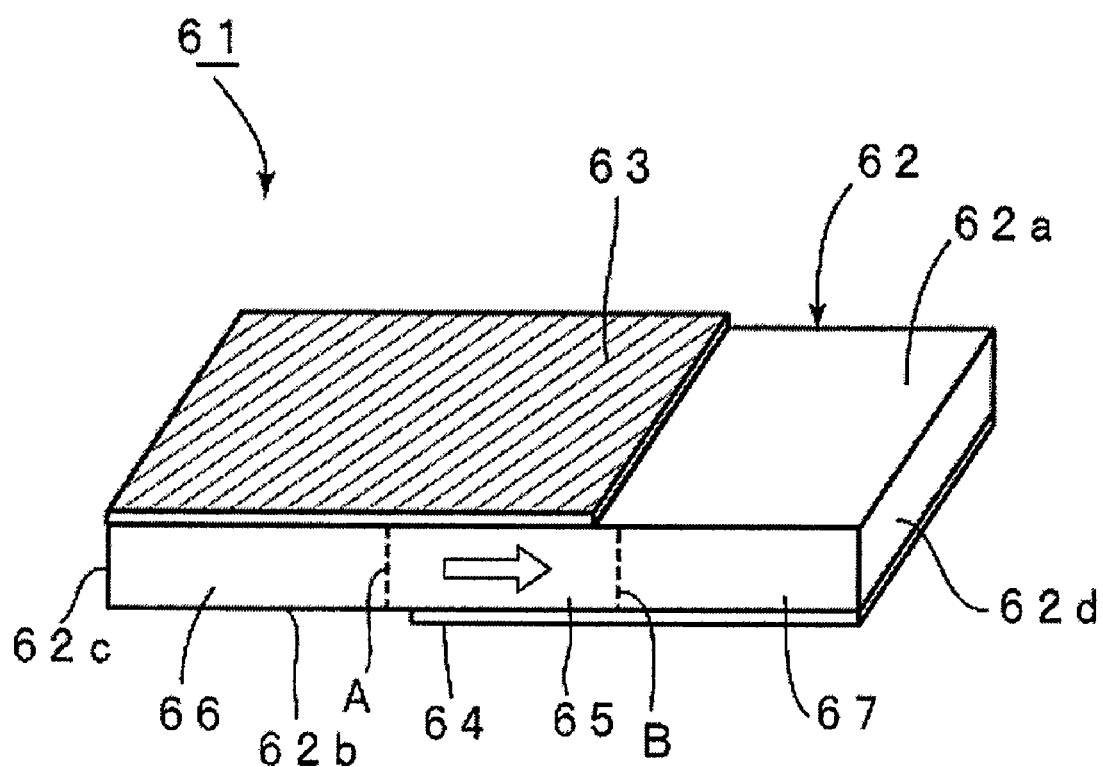
FIG. 30 is a perspective view showing a piezoelectric vibrator according to a fourth embodiment of the present invention.

FIG. 30 is a perspective view showing a piezoelectric vibrator according to a fourth embodiment of the present invention. A piezoelectric vibrator 61 of the fourth embodiment has a strip piezoelectric ceramic substrate 62. The piezoelectric ceramic substrate 62 has an upper face 62a and a lower face 62b as first and second principal surfaces facing each other. The upper face 62a and the lower face 62b are in rectangular shape having the length direction and the width direction. As shown by an arrow in the drawing, the piezoelectric ceramic substrate 62 is polarized in the length direction. In addition, the Young's modulus of non-excitation regions 66 and 67 on outer sides of broken lines A and B is set smaller than that of the piezoelectric substrate material in an excitation region at the center of the piezoelectric ceramic substrate 62, namely, an excitation region 65 sandwiched by the broken lines A and B.

Additionally, a first excitation electrode 63 and a second excitation electrode 64 are formed on the upper face and the lower face of the piezoelectric ceramic substrate 62. As in the case of the first embodiment, the piezoelectric vibration portion is a portion to which an electric field is applied in response to application of alternating voltage to the first and second excitation electrodes 63 and 64 and is vibrated.

As is clear from FIG. 30, also in this embodiment, the piezoelectric vibration portion is narrower than an excitation region 65. More specifically, a portion where the first and second excitation electrodes 63 and 64 overlap through the piezoelectric ceramic substrate 62 is located near a length-direction center of the piezoelectric ceramic substrate 62 than the excitation region.

In addition, regions on outer sides of the excitation region 65 constitute the non-excitation regions 66 and 67 in the fourth embodiment.

The first and second excitation electrodes 63 and 64 are formed in the same manner as that of the piezoelectric vibrator 1 of the first embodiment. Accordingly, the description of the first and second excitation electrodes 3 and 4 is incorporated herein by reference and the description thereof is omitted.

In response to application of alternating voltage to the first and second excitation electrodes 63 and 64, an electric-field applied portion of the piezoelectric vibrator 61 of this embodiment vibrates and the third harmonic overtone of the thickness shear mode is trapped in the excitation region 65 since the Young's modulus of the excitation region and the Young's modulus of the non-excitation region differ.

Trapping of the third harmonic overtone of the thickness shear mode by setting the excitation region and the non-excitation region to have different Young's module values will be described more specifically.

When the Young's modulus of the whole piezoelectric ceramic substrate 62 is uniform, vibration easily propagates but partially trapping the energy becomes difficult. By setting the different Young's modulus values at the non-excitation regions 66 and 67 and the excitation region 65 in this embodiment, the frequency constant of the non-excitation regions 66 and 67 is set to be different from the frequency constant of the excitation region 65. When the Young's modulus of the non-excitation regions 66 and 67 is set smaller than that of the excitation region 65, the frequency constant of the excitation region 65 becomes larger, which allows vibration to be trapped in the excitation region 65. Thus, it is considered that energy trapping with the frequency being increased only in the excitation region 65 is realized.

In addition, the excitation region 65 has a Young's modulus different from that of the non-excitation regions 66 and 67, whereby the propagation of vibration to the non-excitation regions 66 and 67 is suppressed. This suppresses unnecessary reflection at end faces 62c and 62d of the piezoelectric ceramic plate 62. Accordingly, it is possible to reduce the spurious vibration near main response.

Figure 31:
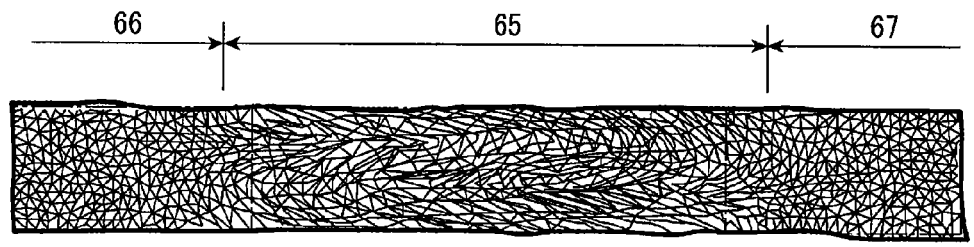
FIGS. 31(a), (b), and (c) are elevational sectional views schematically showing a displacement distribution of a piezoelectric ceramic substrate analyzed using a finite element method when a third harmonic overtone of a thickness shear mode is excited in a piezoelectric vibrator according to a fourth embodiment in a case where a Young's modulus ratio of non-excitation regions is set to 1.0, 0.96, and 0.72, respectively.
Figure 31:
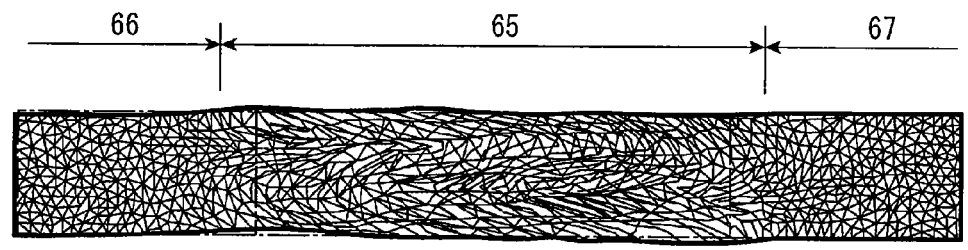
Figure 31:
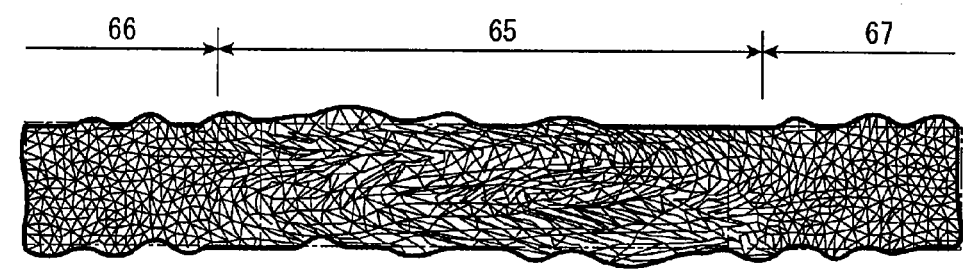

A displacement distribution of the vibration of the piezoelectric vibrator 61 in response to a change in the Young's modulus of the non-excitation regions 66 and 67 when the Young's modulus of the above-descried excitation region 65 is set equal to 1, namely, the Young's modulus ratio, is analyzed using a finite element method. FIGS. 31(a) to (c) show the results. FIGS. 31(a), 31(b), and 31(c) show cases where the Young's modulus ratio is 1.0, 0.96, and 0.72, respectively. A $Pb(Mn_{1/3}Nb_{2/3})O_3$—$PbZrO_3$—$PbTiO_3$ material is used as a piezoelectric material constituting the piezoelectric vibrator 61 and the Young's modulus is adjusted by changing the ratio of Ti to Zr in the analysis performed to obtain the results shown in FIGS. 31(a) to (c), and FIG. 32 and FIG. 33 to be described below. For example, the excitation region having the Young's modulus of $11.4 \times 10^{10}$ Pa and the non-excitation regions having the Young's modulus of $11.1 \times 10^{10}$ Pa can be realized by the following compositions.

Excitation region: $0.1Pb(Mn_{1/3}Nb_{2/3})O_3$-$0.37PbZrO_3$-$0.53PbTiO_3$

Young's modulus=$11.4\times10^{10}$ Pa

Non-excitation region: $0.1Pb(Mn_{1/3}Nb_{2/3})O_3$-$0.38PbZrO_3$-$0.52PbTiO_3$

Young's modulus=$11.1\times10^{10}$ Pa

Meanwhile, a change in the Young's modulus can be achieved by changing the polarization degree in addition to the above-described method of changing the ratio of Ti to Zr. In general, since the Young's modulus is proportional to the polarization degree, the Young's modulus may be set to different values by setting the polarization degree differently between the excitation region and the non-excitation regions.

As is clear from FIG. 31(b), the non-excitation regions hardly displace and the vibration energy is effectively trapped in the excitation region when the Young's modulus ratio is equal to 0.96.

Figure 32:
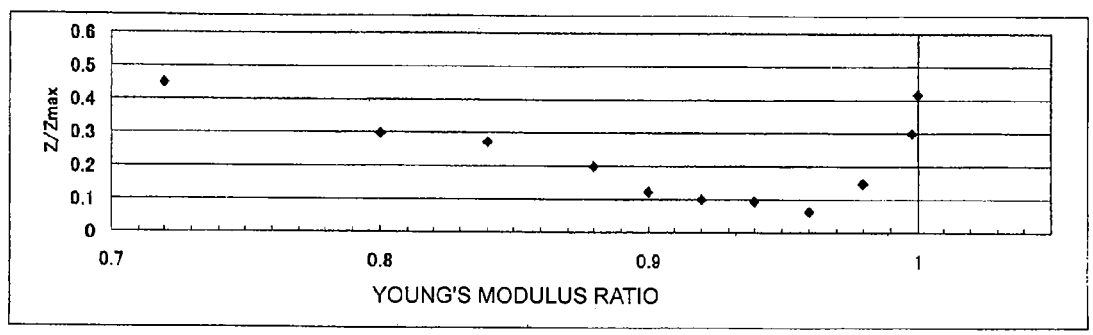
FIG. 32 is a diagram showing a relationship between a Young's modulus ratio of non-excitation regions and a displacement amount ratio $\Delta Z/Z_{max}$ that is an index of an energy trapping efficiency.

FIG. 32 is a diagram showing a relationship between the above-described Young's modulus ratio and the energy trapping efficiency. The horizontal axis of FIG. 32 represents the Young's modulus ratio, whereas the vertical axis represents the ratio of a displacement amount $\Delta Z$ at a length-direction end of the piezoelectric ceramic substrate to a maximum displacement value $Z_{max}$ of the excitation region determined from the analysis using the finite element method. As this ratio $\Delta Z/Z_{max}$ becomes larger, the energy trapping efficiency becomes worse. As is clear from FIG. 32, if the Young's modulus ratio is in a range equal to or greater than 0.80 to equal to or smaller than 0.999, $\Delta Z/Z_{max}$ is equal to or smaller than 0.3. As shown in FIG. 31(b), it is confirmed that the non-excitation regions hardly displace and the energy trapping is performed further preferably.

Accordingly, the Young's modulus ratio is preferably set to a range of 0.8-0.999, and, more preferably, to a range of 0.90-0.98.

Figure 33:
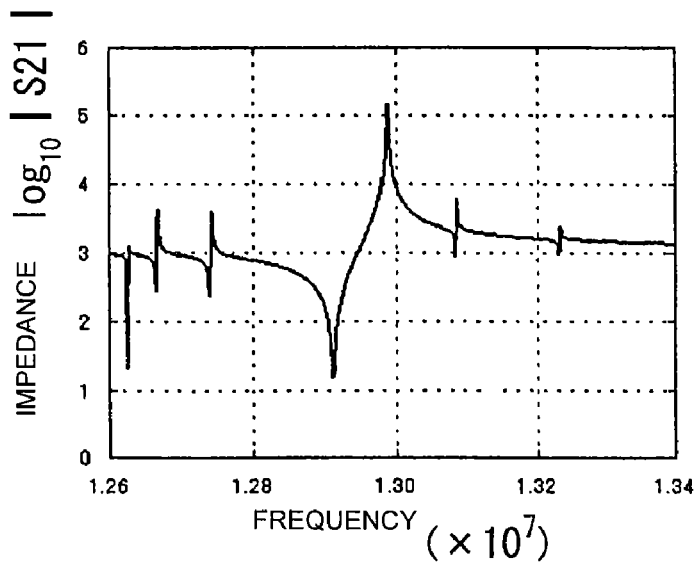
FIG. 33 is a diagram showing an impedance-frequency characteristic of a piezoelectric vibrator of a fourth embodiment having a Young's modulus ratio of 0.96.
Figure 34:
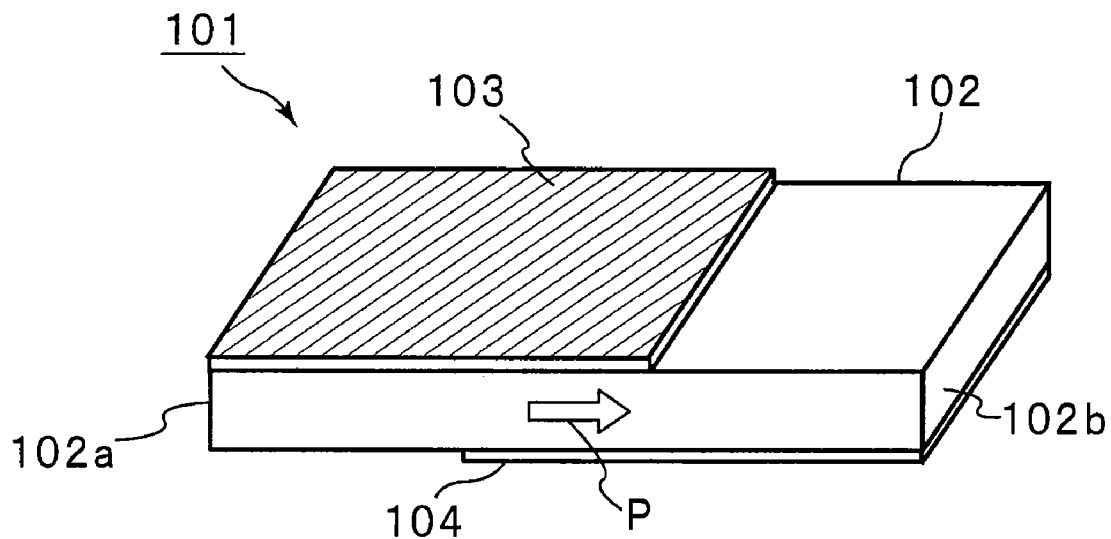
FIG. 34 is a perspective view showing a conventional piezoelectric ceramic resonator.

FIG. 33 shows an impedance-frequency characteristic of a piezoelectric vibrator when the Young's modulus ratio is equal to 0.96, with which such preferable energy trapping is achieved.

As is clear from FIG. 33, it is seen that a main response of the third harmonic overtone of the thickness shear mode appears preferably and ripple does not appear at a frequency band between the resonant frequency and the anti-resonant frequency of the main response.

Although the polarization degree of the excitation region and the polarization degree of the non-excitation regions are set differently in the first to third embodiments, the third harmonic overtone of the thickness shear vibration can be preferably trapped by differently setting the Young's modulus of the excitation region and the Young's modulus of the non-excitation regions such as in the fourth embodiment.

Additionally, although the Young's modulus of the entire non-excitation regions differs from that of the excitation region in the fourth embodiment, the Young's modulus of regions of the non-excitation regions neighboring the excitation region has only to be smaller than that of the excitation region and the Young's modulus of regions of the non-excitation regions other than those neighboring the excitation region may be substantially equal to or higher than the Young's modulus of the excitation region.

More specifically, the polarization degree of regions of the non-excitation regions neighboring the excitation region is set smaller than that of the excitation region in the first to third embodiments. As is clear from the above-described various embodiments and alternative examples, various structures are cited as the structure in which the polarization degree of at least the regions of the non-excitation regions neighboring the excitation region is set to be relatively small. In the case of setting the Young's modulus differently, the structure of making the Young's modulus of at least regions of the non-excitation regions neighboring the excitation region relatively small can be modified as in the case of the above-described various embodiments and alternative examples of the structure of making the polarization degree relatively small.

The invention claimed is:

1. A piezoelectric vibrator comprising:
a strip piezoelectric ceramic substrate having first and second principal surfaces facing each other, having a longitudinal direction and a width direction vertical to the longitudinal direction, and polarized in the longitudinal direction;
a first excitation electrode extending in the width direction of the piezoelectric ceramic substrate at a substantial longitudinal center part of the first principal surface of the piezoelectric ceramic substrate; and
a second excitation electrode overlapping the first excitation electrode through the piezoelectric ceramic substrate at the substantial center part of the piezoelectric ceramic substrate of the second principal surface of the piezoelectric ceramic substrate,
wherein portions of the first and second excitation electrodes overlap in the longitudinal direction define an excitation region excited in response to application of an alternating electric field and portions of the first and second excitation electrodes not overlapping define a non-excitation regions,
wherein the non-excitation regions neighboring the excitation region have (a) the same polarization axis direction as the excitation region and a polarization degree whose absolute value is smaller than an absolute value of a polarization degree of at least one of the excitation region and unpolarized regions, (b) a Young's modulus smaller than that of the excitation region, or both (a) or (b),
whereby an energy-trapping piezoelectric vibration portion utilizing a third harmonic overtone of a thickness shear mode is formed.

2. The piezoelectric vibrator according to claim 1, wherein the non-excitation regions neighboring the excitation region have the same polarization axis direction and smaller polarization degree, and an overlapping length of the portion where the first and second excitation electrodes overlap in the piezoelectric vibration portion along the longitudinal direction of the piezoelectric ceramic substrate is shorter than a length of the excitation region along the longitudinal direction of the piezoelectric ceramic substrate.

3. The piezoelectric vibrator according to claim 2, wherein the entire non-excitation region has the same polarization axis direction as the excitation region and a polarization degree whose absolute value is smaller than the absolute value of the polarization degree of at least one of the excitation region and an unpolarized region.

4. The piezoelectric vibrator according to claim 3, wherein portions of the non-excitation regions which do not neighbor the excitation region have the same polarization axis direction as the excitation region and a polarization degree whose absolute value is smaller than the absolute value of the polarization degree of the excitation region or the non-excitation regions neighboring the excitation region that are not polarized.

5. The piezoelectric vibrator according to claim 2, wherein the entire non-excitation region is polarized.

6. The piezoelectric vibrator according to claim 5, wherein the entire non-excitation region is polarized in the same polarization direction as the first and second excitation electrodes.

7. The piezoelectric vibrator according to claim 1, wherein the entire non-excitation region is polarized.

8. The piezoelectric vibrator according to claim 1, wherein the Young's modulus of portions of the non-excitation regions neighboring the excitation region is smaller than that of the excitation region, and an overlapping length of the portion where the first and second excitation electrodes overlap in the piezoelectric vibration portion along the longitudinal direction of the piezoelectric ceramic substrate is shorter than a length of the excitation region along the longitudinal direction of the piezoelectric ceramic substrate.

9. The piezoelectric vibrator according to claim 8, wherein the Young's modulus of the entire non-excitation region is smaller than that of the excitation region.

10. The piezoelectric vibrator according to claim 9, wherein the piezoelectric ceramic substrate comprises first and second laminated piezoelectric ceramic plates, the first piezoelectric ceramic plate comprises the excitation region and the second piezoelectric ceramic plate comprises a portion of the non-excitation region, wherein the Young's modulus of the first piezoelectric ceramic plate is higher than that of the second piezoelectric ceramic plate.

11. The piezoelectric vibrator according to claim 10, wherein, when the Young's modulus of the excitation region is set to 1, the Young's modulus of the portion of the non-excitation region having the lower Young's modulus is within a range of 0.80-0.999.

12. The piezoelectric vibrator according to claim 1, wherein a dummy electrode is on at least one of the first and second principal surfaces of the piezoelectric ceramic substrate at a non-excitation region, and the dummy electrode has a thickness which is greater than a thickness of the excitation electrodes.

13. The piezoelectric vibrator according to claim 1, wherein the excitation electrodes to reach edges located at respective width-direction ends of the piezoelectric ceramic substrate.

14. The piezoelectric vibrator according to claim 1, wherein the first and second excitation electrodes are separated from the respective width-direction ends of the piezoelectric ceramic substrate by a gap.

15. A method for manufacturing a piezoelectric vibrator according to claim 1, comprising:
  providing a mother piezoelectric ceramic substrate having first and second principal surfaces facing each other, a longitudinal direction and a width direction vertical to the longitudinal direction, first and second end faces at respective longitudinal ends, and polarization electrodes on the first and second end faces of the mother piezoelectric ceramic substrate;
  conducting a first polarization comprising polarizing the mother piezoelectric ceramic substrate in the longitudinal direction;
  conducting a second polarization comprising polarizing the mother piezoelectric ceramic substrate so that a polarization degree of a portion where an excitation region is to formed is higher than that of a portion where a non-excitation region is to be formed in the mother ceramic substrate;
  providing a plurality of first and second excitation electrodes on the respective first and second principal surfaces of the mother piezoelectric ceramic substrate; and
  cutting the mother piezoelectric ceramic substrate into a plurality of individual piezoelectric vibrators.

16. The method for manufacturing the piezoelectric vibrator according to claim 15, wherein the second polarization comprises providing floating electrodes at the excitation region of the first and second principal surfaces of the mother piezoelectric ceramic substrate, and applying direct voltage across the first and second end faces of the mother piezoelectric ceramic substrate in a direction opposite to that of the first polarization to lower the polarization degree of the non-excitation region.

17. The method for manufacturing the piezoelectric vibrator according to claim 15, wherein the second polarization comprises providing floating electrodes at the non-excitation region of the first and second principal surfaces of the mother piezoelectric ceramic substrate, and applying direct voltage across the first and second end faces of the mother piezoelectric ceramic substrate in the same direction as that of the first polarization.

18. A method for manufacturing a piezoelectric vibrator according to claim 15, wherein
  prior to the first polarization, providing floating electrodes at boundaries of an excitation region and a non-excitation region of the first and second principal surfaces; and wherein
  the first polarization comprises polarizing the mother piezoelectric ceramic substrate so that polarization directions of regions on both sides of the floating electrodes in the longitudinal direction of the mother piezoelectric ceramic substrate are opposite in the longitudinal direction in the mother piezoelectric ceramic substrate; and
  the second polarization comprises applying voltage across the floating electrodes on both sides of the excitation electrodes to increase only the polarization degree of the excitation region after the first polarization step.

* * * * *